US009659822B2

(12) United States Patent
Theeuwes et al.

(10) Patent No.: US 9,659,822 B2
(45) Date of Patent: May 23, 2017

(54) PROVIDING A CHIP DIE WITH ELECTRICALLY CONDUCTIVE ELEMENTS

(71) Applicant: Nederlandse Organisatie voor toegepast-natuurwetenschappelijk onderzoek TNO, The Hague (NL)

(72) Inventors: Johannes Adrianus Cornelis Theeuwes, The Hague (NL); Jeroen Anthonius Smeltink, The Hague (NL); Egbert Anne Martijn Brouwer, The Hague (NL); Gerrit Oosterhuis, The Hague (NL)

(73) Assignee: NEDERLANDSE ORGANISATIE VOOR TOEGEPAST-NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

(21) Appl. No.: 14/903,525

(22) PCT Filed: Jul. 8, 2014

(86) PCT No.: PCT/NL2014/050461
§ 371 (c)(1),
(2) Date: Jan. 7, 2016

(87) PCT Pub. No.: WO2015/005779
PCT Pub. Date: Jan. 15, 2015

(65) Prior Publication Data
US 2016/0155666 A1    Jun. 2, 2016

(30) Foreign Application Priority Data
Jul. 8, 2013 (EP) .................................... 13175623

(51) Int. Cl.
*H01L 21/44* (2006.01)
*H01L 21/768* (2006.01)
(Continued)

(52) U.S. Cl.
CPC .... *H01L 21/76898* (2013.01); *B23K 26/0622* (2015.10); *B23K 26/082* (2015.10);
(Continued)

(58) Field of Classification Search
CPC . H01L 21/4763; H01L 21/768; H01L 21/687; H01L 21/68; H01L 21/285; C23C 14/04; C23C 14/54; G05B 19/418
See application file for complete search history.

(56) References Cited

U.S. PATENT DOCUMENTS

2004/0111174 A1    6/2004  Hunter et al.
2010/0233874 A1*   9/2010  Ito ..................... H01L 21/76823
                                                              438/600
(Continued)

FOREIGN PATENT DOCUMENTS

WO    WO 2007/077630 A1    7/2007
WO    WO 2009/081355 A2    7/2009
WO    WO 2011/145930 A1    11/2011

OTHER PUBLICATIONS

European Patent Office, Office Action in European Application No. 14741972.5 dated Dec. 12, 2016 (10 pages).

*Primary Examiner* — Caleb Henry
(74) *Attorney, Agent, or Firm* — Leydig, Voit & Mayer, Ltd.

(57) ABSTRACT

A method for providing position control information for controlling an impingement position of a laser beam for treatment of a chip die in a chip manufacturing process, comprises the steps of a) receiving a specification of positions (x,y) of a electrically conductive elements in the chip (Continued)

die, the positions having a first coordinate along a first direction (x) and a second coordinate (y) along a second direction in a plane defined by the chip die, said first and second direction being mutually transverse to each other, b) selecting a cluster of positions that is within a predetermined two-dimensional spatial range, wherein each pair of positions in the cluster at least has a first minimum difference in their first coordinates or a second minimum difference in their second coordinates and removing the next position from the ordered set, c) update the positions of the set of positions in accordance with an expected time needed to carry out the treatment for said cluster and a speed of a wafer comprising the chip die, d) repeating steps b-d until each of the positions in said set is assigned to a cluster.

20 Claims, 16 Drawing Sheets

(51) Int. Cl.
| | | |
|---|---|---|
| C23C 14/04 | (2006.01) | |
| H01L 21/285 | (2006.01) | |
| B23K 26/08 | (2014.01) | |
| B23K 26/34 | (2014.01) | |
| C23C 14/54 | (2006.01) | |
| B23K 26/32 | (2014.01) | |
| B23K 26/082 | (2014.01) | |
| B23K 26/0622 | (2014.01) | |
| G05B 19/418 | (2006.01) | |
| H01L 21/68 | (2006.01) | |
| H01L 21/687 | (2006.01) | |
| B23K 101/40 | (2006.01) | |
| B23K 103/08 | (2006.01) | |
| B23K 103/10 | (2006.01) | |
| B23K 103/12 | (2006.01) | |
| B23K 103/18 | (2006.01) | |
| B23K 103/00 | (2006.01) | |

(52) U.S. Cl.
CPC .......... *B23K 26/0853* (2013.01); *B23K 26/32* (2013.01); *B23K 26/34* (2013.01); *C23C 14/048* (2013.01); *C23C 14/54* (2013.01); *G05B 19/418* (2013.01); *H01L 21/2855* (2013.01); *H01L 21/68* (2013.01); *H01L 21/68785* (2013.01); *H01L 21/76838* (2013.01); *B23K 2201/40* (2013.01); *B23K 2203/08* (2013.01); *B23K 2203/10* (2013.01); *B23K 2203/12* (2013.01); *B23K 2203/18* (2013.01); *B23K 2203/50* (2015.10); *B23K 2203/56* (2015.10); *G05B 2219/33198* (2013.01); *G05B 2219/45031* (2013.01)

(56) References Cited

U.S. PATENT DOCUMENTS

2011/0210105 A1 9/2011 Romashko et al.
2016/0056071 A1* 2/2016 Draeger ............ H01L 23/53238
　　　　　　　　　　　　　　　　　　　　438/653

* cited by examiner

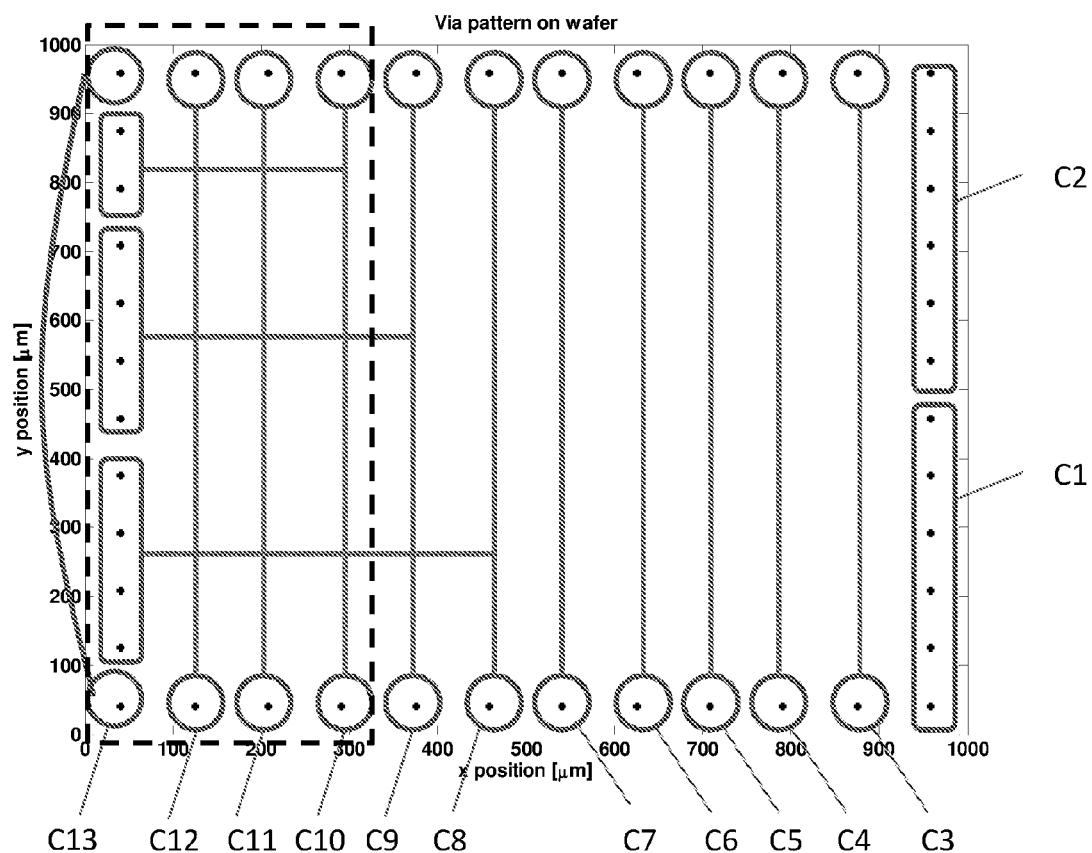
FIG. 9
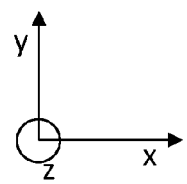

PROVIDING A CHIP DIE WITH ELECTRICALLY CONDUCTIVE ELEMENTS

CROSS-REFERENCE TO RELATED APPLICATIONS

This application is a U.S. National Phase of PCT International Application No. PCT/NL204/050461, filed Jul. 8, 2014, which claims priority from European Application No. 13175623.1, filed Jul. 8, 2013, which are incorporated by reference in their entirety, including any references contained therein.

FIELD OF THE INVENTION

The invention relates to a chip the treatment apparatus and a treatment method arranged for treatment chip dies in a chip manufacturing process.

The method further relates to a method of determining position control information for use in the treatment method and the treatment apparatus.

The method still further relates to a record carrier comprising the position control information.

BACKGROUND OF THE INVENTION

In the ongoing miniaturization process of integrated circuit devices, the latest developments involve the manufacture of multiple stacks of ultrathin silicon dies having thicknesses reduced to sub 100 micron, or even in the 10-50 micron zone. This stacking of ICs in a package is also referenced as 3D stacking. For a 3D stack to be functional, vertical connectors, known as Through Silicon Vias (TSVs) are necessary, as well as additional layers of horizontal interconnecting structures. Generally, a TSV can be seen as a through hole through the thin die; this hole structure typically needs a wall liner treatment, in the remainder also referenced as cladding which may include for example, a barrier layer, isolation layer or seed layer. In addition, the TSV is provided with a filling of a conductive matter such as Cu. The width of a TSV is typically sub 10 micron, and a filling resolution of 2-5 micron is therefore desired.

To obtain such resolution WO2011/145930 proposes a chip die TSV treatment apparatus arranged for treatment of TSVs in chip dies in a chip manufacturing process.

The apparatus comprises a carrier plate arranged for placement of a wafer having identified TSVs to be treated. The apparatus further comprises a donor guiding system for guiding a donor over a TSV to be treated. The guiding system is adapted to keep the donor distanced from the wafer top surface. The apparatus further comprises an alignable laser system arranged for impinging a laser beam on a side of the donor opposite a side facing the wafer. The laser beam is tuned in timing, energy and direction to generate donor matter directed towards the TSV. A control system is provided for aligning the laser beam and the donor guiding system relative to the TSV. In an embodiment, the alignable laser system in the known apparatus comprises a fast beam modulator, such as a galvano mirror, polygon mirror, acousto-optic or electro-optic modulator that provides a scanning movement of the laser beam in a first direction. In practice each single TSV is treated by a multishot process where repeated steps are provided of guiding fresh donor material relative to the TSV.

FIG. 1 schematically shows a chip die TSV treatment as disclosed in the cited document. The known treatment comprises clamping a wafer 110 having identified TSVs 100 to be treated. The TSVs are typically provided in a basic pattern that is repeated, wherein each basic pattern corresponds to the TSVs for a single die of a plurality of dies to be manufactured from the wafer. The treatment subsequently comprises providing a donor 130 distanced from the wafer top surface 111; aligning the laser beam 102 of the laser system 120 and guiding the donor 130 relative to an identified TSV 100 on the wafer 110; and impinging a laser beam 102 on a side 131 of the donor 130 opposite a side facing 132 the wafer 110; the laser beam 102 tuned in timing, energy and direction to generate donor matter in the form of a plasma 140 directed towards a TSV 100 to be treated, in order to provide the TSV with a cladding. Accordingly, a plasma 140 is generated of a donor 130 preferably chosen of a group of Tantalum (Ta), Tantalum Nitride (TaN), Titanium (Ti), Titanium Nitride (TiN). The clamp 112 may be made of silicon, glass or epoxy based support. In an embodiment, the clamp 112 is a vacuum clamp, for example, of porous aluminum, where a vacuum is provided underneath the wafer 110 and transferred to the clamping zones 114 via channels 113.

FIG. 1A shows the treatment in more detail, here as a process subsequent to the cladding treatment of FIG. 1. Therein the TSV 100 is filled with a conductive material 200 such as Copper wherein subsequent donor matter 231 is directed towards a TSV 100 by directing particles 231 of a subsequent donor 230 into the TSV 100. Preferably, the cladding and filling step are performed in the same process environment 300 with subsequent donors 130, 230. Accordingly, in this process, the TSV treatment involves filling the TSV 100, by having donor matter 231 directed towards a TSV 100 to be treated. In a multishot process repeated steps are provided of guiding fresh donor material 230 relative to the TSV 100 and impinging the laser beam 102 on the donor 230 so as to direct a particle 231 of donor matter into the TSV 100. Suitable conductors 200 include Copper, Aluminum, Tungsten, Chromium, Polysilicon. To carry out the method in a suitable way for via filling purposes and for vias having a typical diameter in the range of 5-15 microns, an aspect ratio of 1:5-1:10, and a depth typically in the range of 20-100 microns, filling droplets preferably range between 2-10 micron. To achieve cost-effective filling at a rate of at least 1000-3000 vias per second, a laser repetition rate is preferably at least 60-600 kHz. For filling TSVs droplets may be used having a typical diameter of 2-10 micrometer.

FIG. 2 schematically shows a method as disclosed by the above-cited document. As schematically illustrated therein, a laser beam 102 is directed towards a scanning stage having a wafer 110 clamped thereon. A fast beam modulator 400 (galvano mirror, polygon mirror, acousto-optic or electro-optic modulator etc.) provides a scanning movement of the laser beam 102 in a first direction (x). Each single TSV 100 is treated by a multishot process where repeated steps are provided of guiding fresh donor material 230 relative to the TSV 100 and generating a particle 231.

In Step (1) as show in the top left figure, the donor 230 is kept fixed relative to the wafer surface 111, and the laser beam 102 is scanned over the various TSVs 100 by a tilting movement of a beam modulator 400.

As shown in the top right figure the donor 230 is shifted relative to the wafer 110 in the direction x.

In Step (2), as shown in the middle left figure, the scanning steps are repeated after the donor 230 is shifted relative to the wafer 110. Thus fresh donor material 230 is directed to each TSV 100.

As shown in the middle right figure the donor 230 is shifted a further step relative to the wafer 110 in the direction x.

In Step (3) the same scanning movement is repeated with the donor material 230 shifted a further step.

Accordingly, after each scan of the laser beam, wherein a series of TSV is partially filled, the donor guiding system shifts fresh donor material in front of the TSVs to be filled. The cited document notes that the shifting steps can be performed in both planar directions to cover the entire wafer surface. Alternatively, the wafer can be continuously moved in a direction perpendicular to the scanning beam movement. In practice a relatively high number of shots is necessary to fill each TSV (e.g. in the number of 100). As a result, the donor 230 has to be transported at a high speed, e.g. 10 m/s or more along the wafer to be treated in order to supply fresh donor material at a sufficient rate to achieve a sufficient productivity. A strip thereof having a width corresponding to the spot size of the laser beam, e.g. in the order of 10-20 micrometers is used for providing the donor material. This requires large stocks with donor material. An efficient use of donor material is desirable. However, re-use by re-routing processed donor material requires a very rapid and precisely controlled feedback system to ensure that donor material to be ejected is always present.

SUMMARY OF THE INVENTION

According to a first aspect of the invention, there is provided a chip die treatment apparatus according to claim 16.

According to a second aspect, there is provided a method of treatment of chip dies in a chip manufacturing process according to claim 8.

In summary, the apparatus according to the first aspect and the method according to the second aspect obtaining clustered information about target positions where electrically conductive features are to be applied on the chip die. During execution of the method or in an operational state of the apparatus a laser beam is directed towards a source position on a donor facing a target position on the wafer with the chip dies. Therewith donor matter is transferred from a source range in the wafer surrounding the source position to a deposition range of the wafer surrounding the target position. Donor matter from mutually disjunct source ranges of the donor is transferred to mutually overlapping deposition ranges.

According to the present invention the above-described transfer step is applied at least once for each target position as specified in the cluster until a next cluster is selected. During application of the transfer step for the target positions in a cluster the laser beam is directed within a field of view that substantially extends in a direction transverse to the transport direction of the donor. I.e. the field of view may extend over a distance of 100 micron or more in the direction transverse to the transport direction. Preferably the field of view is a two-dimensional field of view that extends in each direction over a distance of 100 micron or more.

By transferring donor material to the die according to a cluster pattern that extends in a direction transverse to a transport direction of the carrier of the donor material, preferably according to a cluster pattern extending in a two-dimensional target area, the donor speed can be lowered drastically downwards and the efficiency of use of the donor can improve significantly as is described in more detail below.

The method and apparatus are suitable to apply various kind of electrically conductive elements in a chip die. In a first application the electrically conductive elements to be provided comprise at least one electrically conductive track, and the clustered target positions are mutually disjunct positions arranged along a trajectory to be provided with said electrically conductive track. Therein the trajectory extends in a plane coinciding with a main surface of the die.

Depending on the circumstances, this may be realized in different ways.

According to a first embodiment the clustered control information comprises at least a first and a second cluster with target positions arranged along the trajectory, wherein the target positions of the first cluster have mutually non-overlapping target ranges, and the target positions of the second cluster have mutually non-overlapping target ranges and wherein the target ranges of the target positions of the first cluster overlap the target ranges of the target positions of the second cluster.

According to a second embodiment the clustered control information comprises at least a first cluster having target positions with mutually overlapping target ranges.

In the final product the electrically conductive track need not necessarily extend on the main surface, but may alternatively be arranged in a plane parallel with the main surface. This may be the case if subsequent to application of the electrically conductive material that forms the electrically conductive track one or more layers are applied that cover the electrically conductive track.

The target positions may be specified as groups of target positions arranged along the trajectory of the track to be formed. Instead of specifying the target positions individually a specification may be provided of that trajectory, e.g if the trajectory is a line by specifying its end points, or if the trajectory is a curve by specifying control points of a spline defining that curve.

In another important application the electrically conductive elements comprise transverse electrical connections that extend in a direction transverse to the main surface through a TSV in the die, and wherein the specification of target positions (x,y) comprises positions of a set of TSVs in the chip die.

In this case the treatment step carried out by the method and apparatus according to the present invention is repeated substantial number of times for each cluster. For example, each target range, formed by a TSV, may receive a substantial portions of donor material from a plurality, e.g. 20-200, of source ranges of the donor.

According to a third aspect of the invention there is provided a method of determining clustered position control information as specified in claim 1.

In summary the method according to the method comprises the steps of a) receiving a specification of a set of target positions (x,y) where the electrically conductive elements, e.g. locations of TSV's or locations along a trajectory to be provided with a conducting track, are to be formed on the chip. The target positions have a first coordinate along a first direction (x), which may correspond to a transport direction of the donor in an operational state of the apparatus according to the first aspect or during execution of the method according to the second aspect. The target positions have a second coordinate (y) transverse to the first coordinate.

b) selecting from said target positions a cluster of target positions that is within a predetermined two-dimensional spatial range, wherein each pair of target positions in the cluster at least has a first minimum difference in their first coordinates or a second minimum difference in their second coordinates and removing the target positions selected for said cluster from the set of target positions, c) update the positions of the remaining target positions in the set of target positions in accordance with an expected time needed to deposit electrically conductive material on the target positions in the cluster of target positions and a speed with which a wafer comprising the chip die is to be moved during the chip manufacturing process, d) repeating steps b-d until each of the target positions in said set of target positions is assigned to a cluster.

According to a fourth aspect of the invention there is provided a record carrier comprising position control information as specified in claim 17.

In an embodiment the record carrier implicitly indicates the sequence wherein clusters are to be processed by the order in which the clusters are arranged in the storage medium.

In an other embodiment the record carrier comprises a first sequence indicator for indicating the sequence wherein clusters are to be processed.

In case the electrically conductive elements to be applied include transverse electrical conductors to be applied within respective TSVs of a cluster, the sequence for processing TSVs of a cluster may be indicated implicitly by the order in which the positions of the TSV's are arranged in the storage medium.

Alternatively, the record carrier may comprises a second sequence indicator for indicating a sequence wherein TSVs of a cluster are to be processed.

BRIEF DESCRIPTION OF THE DRAWINGS

These and other aspects are described in more detail with reference to the drawing. Therein:

FIG. 9 illustrates a result of application of the method of FIG. 7 to a chip the having a set of TSVs arranged along the edges of the die.

DETAILED DESCRIPTION OF EMBODIMENTS

Figure 1:
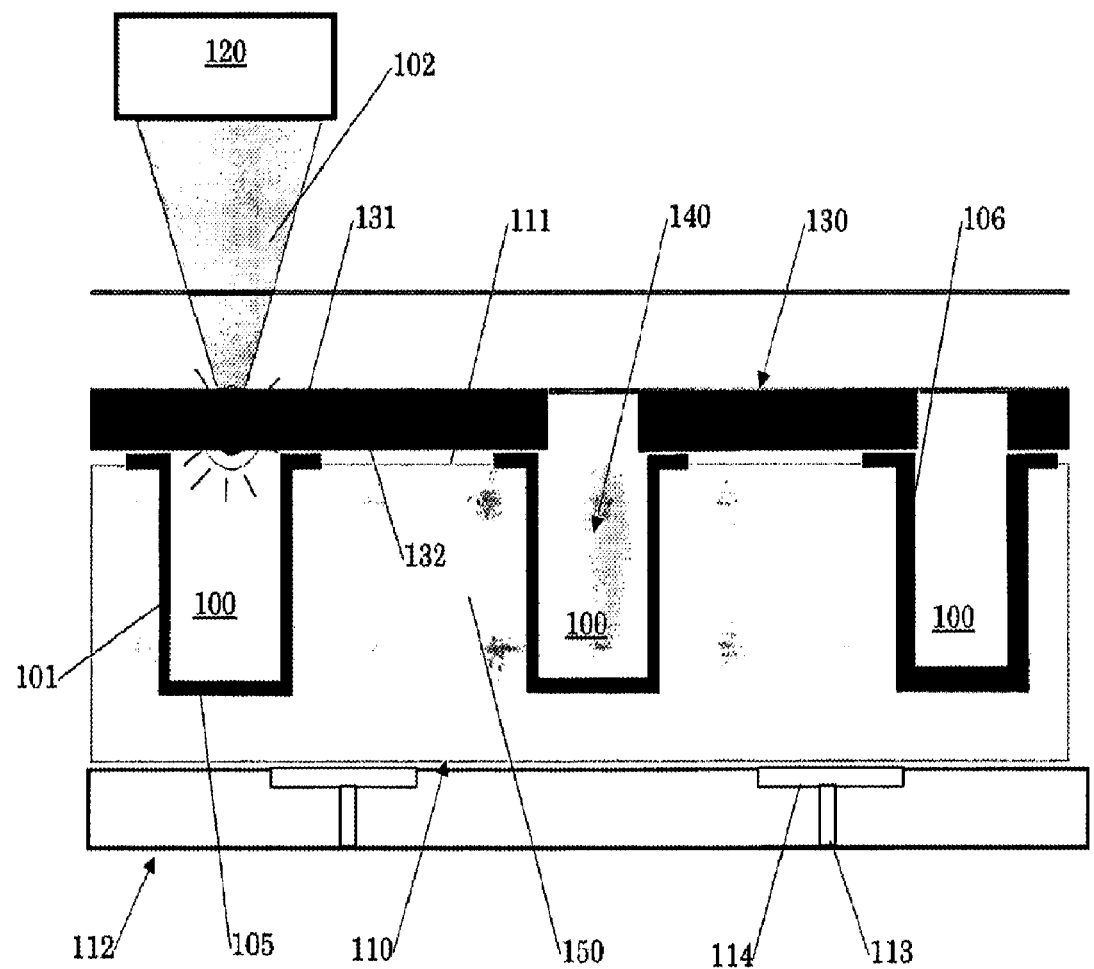
FIG. 1 schematically shows a known chip die TSV treatment.
Figure 1A:
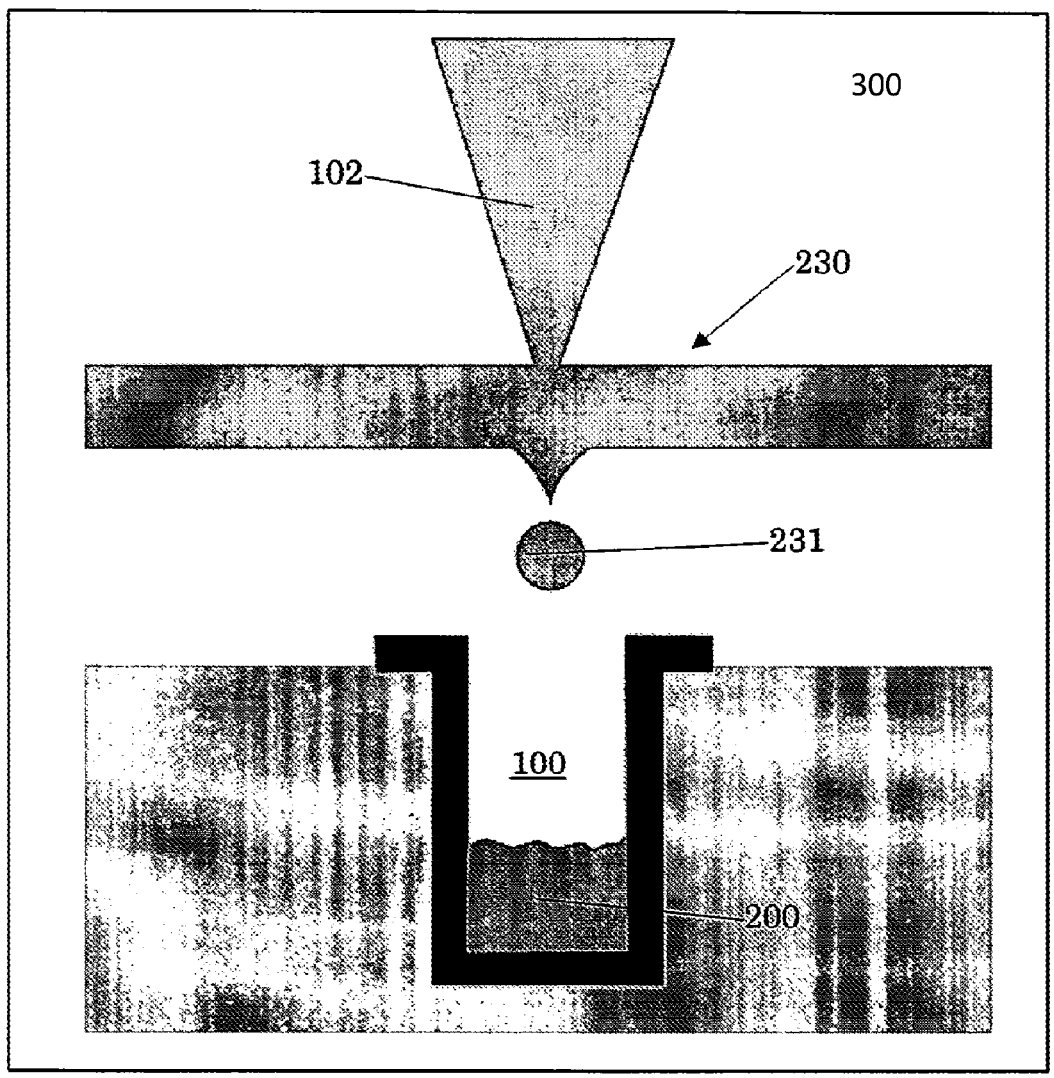
FIG. 1A shows an aspect of the treatment in more detail.

Like reference symbols in the various drawings indicate like elements unless otherwise indicated.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 3:
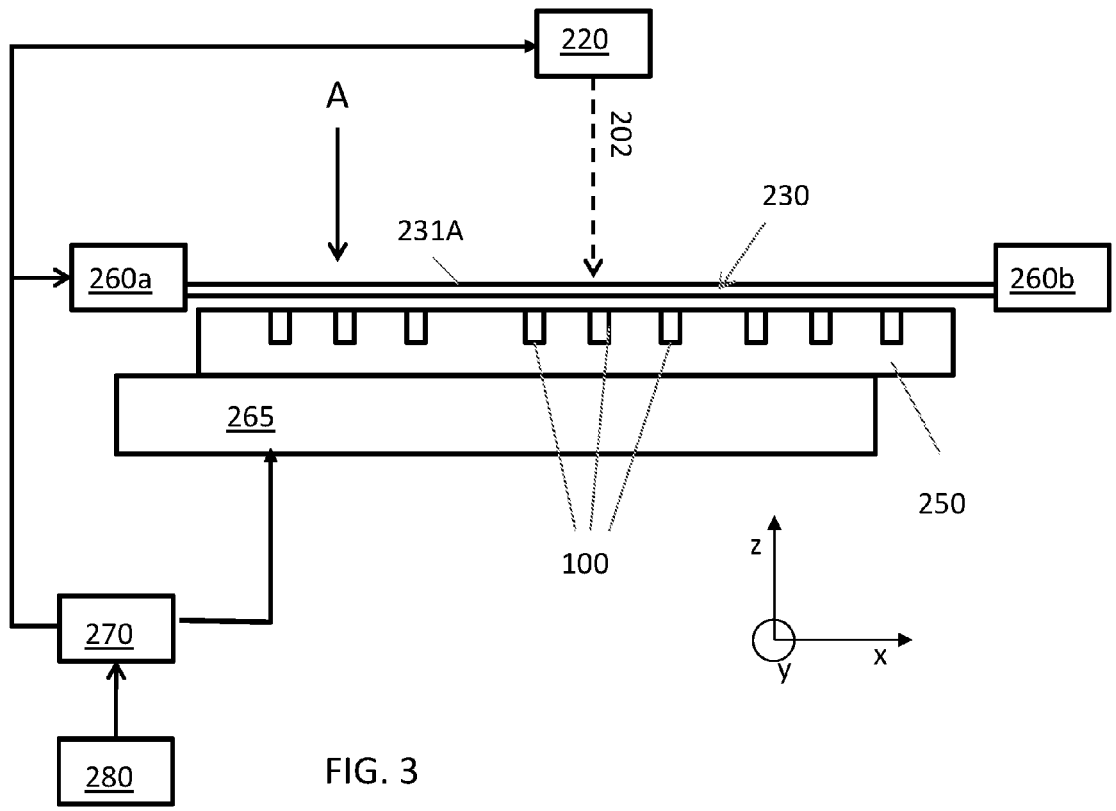
FIG. 3 schematically shows a chip the Through Silicon Via (TSV) treatment apparatus according to an embodiment of the present invention.

FIG. 3 schematically shows an embodiment of a chip die TSV treatment apparatus arranged for treatment chip dies in a chip manufacturing process, for example for treatment of TSVs 100 in chip dies. The apparatus comprises a carrier plate comprising clamping zones (e.g. 114 in FIG. 1) on a top face arranged for placement of a wafer 250 having identified TSVs 100 to be treated. Also the wafer may comprise trajectories to be provided with an electrically conductive track, see the example described with reference to FIGS. 14A-C and FIG. 15A,B. The apparatus has a donor guiding system 260a, 260b for guiding a donor 230 along a first direction (x) over a wafer to be treated. The donor is provided on a face of a transparent carrier. The guiding system 260a, 260b is adapted to keep the donor 230 distanced from a top surface of the wafer. The apparatus further has an alignable laser system 220 arranged for impinging a laser beam 202 at a target position within a field of view on a side 231A of the donor 230 opposite a side facing the wafer 250. The alignable laser system 220 comprises a fast beam modulator, such as a galvano mirror, polygon mirror, acousto-optic or electro-optic modulator The laser beam 202 is tuned in timing, energy and direction to generate donor matter directed towards the wafer. The laser beam 202 is arranged to impinge on the donor via a carrier face opposite the donor, whereas the face having the donor faces the wafer 250. The apparatus further has a wafer displacement facility 265 for displacing the wafer 250. The apparatus further has a control system 270 for controlling alignment of the laser beam 202 as well as for controlling the donor guiding system 260a, 260b and the wafer displacement facility 265. The treatment apparatus has a facility for obtaining clustered information about positions of electrically conductive elements, for positions of TSVs to be filled or positions along a trajectory where an electrically conductive track is to be formed from donor material. The controller is arranged to read this information from a record carrier 280. Alternatively, the controller may obtain this information using a pattern recognition process that analyzes an image of the wafer.

Figure 3A:
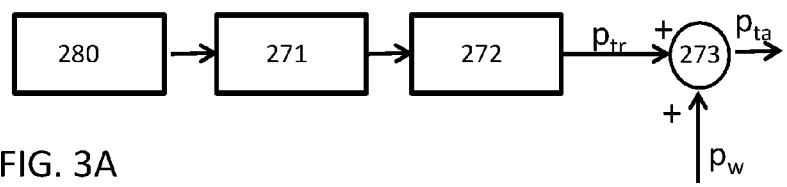
FIG. 3A shows a part of this embodiment in more detail, FIG. 4A,4B schematically show a possible treatment method, therein

FIG. 3A shows a part of the controller 270 in an embodiment of the chip die treatment apparatus as shown in FIG. 3. Therein 271 is a memory interface for reading data from the record carrier 280. In use, the memory interface 271 reads the clustered information from the record carrier. Each cluster comprises a set of feature positions arranged within a two-dimensional range of a die. A feature position is a relative position $p_{tr}$ with respect to the wafer of a TSV or of a point on a trajectory to be provided with an electrically conductive track. A scan control unit 272 selects a cluster of feature positions and repeatedly outputs a sequence of coordinates each specifying a feature position to an input of add unit 273. The add unit 273 further receives a current position $p_w$ of the wafer and provides the absolute position $p_{ta}$ of the feature positions to be treated to the alignable laser system 220.

If the clustered information concerns electrically conductive tracks to be formed, the clustered information may comprise sequences of positions along a trajectory to be provided with an electrically conductive track. Alternatively, the trajectory in the form of a straight line may be specified by its end points. Likewise a piecewise linear trajectory may be specified by the end-points of its constituent parts, and curved trajectory may for example be specified by control points of a spline.

As was indicated in the background part of this application the known apparatus requires a high donor speed in order to supply fresh material at a sufficient rate to enable a sufficient production efficiency. According to the present invention the laser beam is scanned according to a direction y transverse to the transport direction. In this way a larger width of the donor material is used, so that at a lower speed of the donor material in the transport direction x a higher amount of donor material can be used to fill the TSVs or for depositing donor material along a trajectory in the plane of the wafer.

This will be illustrated by the following example, wherein the electrically conductive elements comprise a plurality of TSV's to be filled. The cross-section of each TSV forms a target range for the donor material.

Suppose that the number of shots per via, i.e. the number of times donor material has to be injected in each TSV is equal to 2, then for the pattern shown a total of 16 donor locations has to be consumed in order to fill all TSVs, which is achieved with 16 laser pulses. It is noted that in practice the required number of shots per via is substantially higher, e.g. about 100, however, for the purpose of the present example a number 2 is presumed.

In the known method as described with reference to FIG. 2 herein, the required displacement of the donor material for each set of 8 TSVs is at least 16 times the size of the diameter of the consumed donor locations.

Figure 4A:
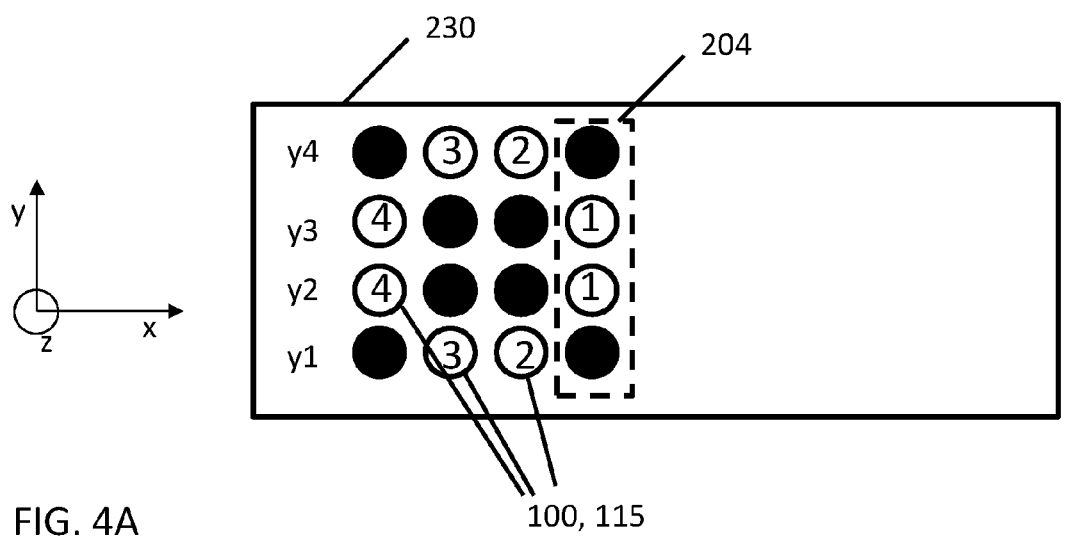
FIG. 4A shows a pattern of clustered TSVs on a wafer and FIG. 4B shows a corresponding donor usage pattern, according to said method, FIG. 5A,5B schematically show a treatment method according to an embodiment of the present invention, therein
Figure 4B:
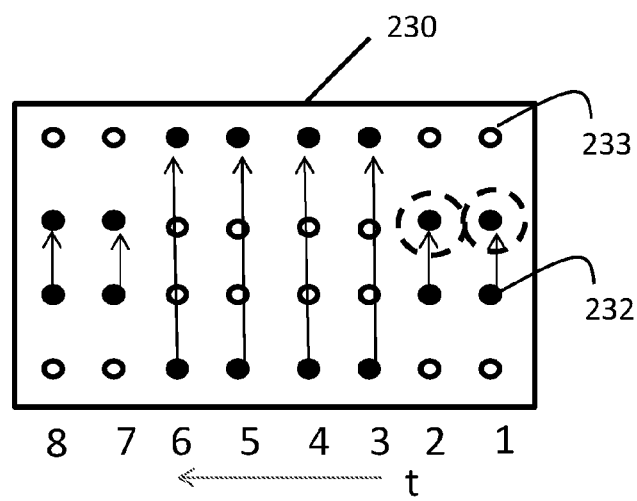

FIG. 4A illustrates a method according to the second aspect of the invention, which may be carried out by an apparatus according to the first aspect of the invention. Therein FIG. 4A is a top-view according to A in FIG. 3, wherein only the donor 230, a portion of the wafer with TSVs 100 and the field of view 204 of the laser beam are shown. The circular dots in FIG. 4A show a grid. Therein the numbered open dots are TSV-positions and the closed dots indicate locations wherein a TSV is absent. According to the method shown in FIG. 4A, the laser beam is scanned in a direction y transverse to the transport direction x of the donor material 230. Subsequently set 1, set 2, set 3 and set 4 of TSVs is treated. The donor use in that case is illustrated in FIG. 4B. Therein the filled dots 232 indicate the source ranges of the donor and the open dots 233 indicate unused source ranges. It is noted that in practice the source ranges will have a larger area, e.g. as indicated by the dashed circles in FIG. 4B. In the example shown, at time t=1, the TSVs of set 1 are treated, this is repeated at time t=2, when the donor material 230 is translated in the direction x. Subsequently at time t=3 the next set 3 of TSVs is treated, which is repeated at time t=4, etc. Accordingly, after 8 time units the TSVs in the pattern are completely filled so that the donor material 230 deposited therein forms an electrical conductor 115 transverse to the plane of the die. Therewith the treatment of the pattern of FIG. 4A is completed, and the required displacement of the donor material is reduced to 8 times the diameter of the consumed donor locations. It can be seen in FIG. 4B that about ½ of the donor material is consumed.

Figure 5A:
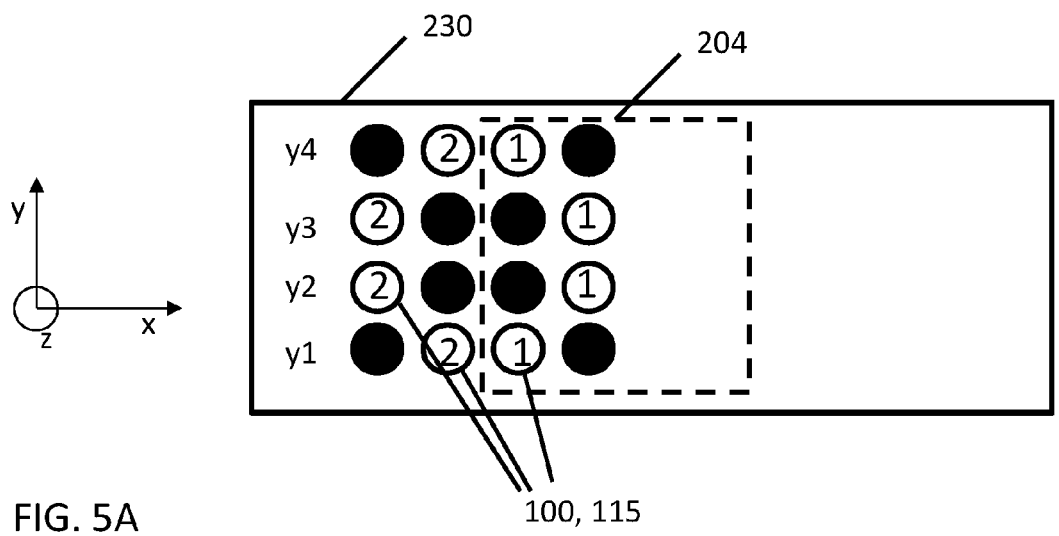
FIG. 5A shows a pattern of clustered TSVs on a wafer and FIG. 5B shows a corresponding donor usage pattern, according to said method.
Figure 5B:
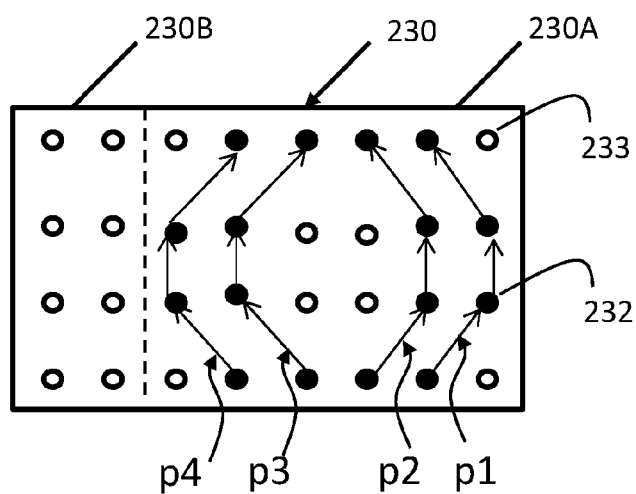

FIGS. 5A and 5B depict a preferred method according to the second aspect of the present invention. FIG. 5A is a top-view according to A in FIG. 3, wherein only the donor 230, a portion of the wafer with TSVs 100 and the field of view 204 of the laser beam are shown. As can be seen in FIG. 5A, the field of view 204 is a two-dimensional range. Furthermore the TSVs are arranged in clusters, that include a respective set of TSVs within a two dimensional range of the die. In the example shown in FIG. 5A the TSVs 100 are arranged in two clusters denoted 1 and 2. The control system 270 is arranged to repeat the following steps a) and b) a predetermined number of times for each cluster 1, 2 of TSVs 100. In step a) the control system 270 determines the actual positions of the TSVs 100 within the cluster and subsequently the control system 270 aligns the laser beam 202 within the two-dimensional field of view 204 to a respective impingement position corresponding to the actual position of each TSV 100. When the TSVs 100 in the cluster are filled the donor material 230 deposited therein forms an electrical conductor 115 transverse to the plane of the die. In this way the donor can be used substantially more efficient than would be the case with the known device, while the speed with which the donor is transported can be decreased and kept within modest values.

In the context of the present example the field of view is a square area having a size corresponding to 4 TSVs. In practice the field of view may have a substantially larger size, e.g. in the range of 1×1 mm. The field of view is not necessarily a square area, but may for example be oval or rectangular. Within the two-dimensional field of view the laser beam 202 is directed along a plurality of TSV positions that are arranged along a curved or a piecewise linear trajectory, i.e. typically not according to a straight line. Hence, in a first time unit the laser beam 202 is guided along the set of TSVs 1 to be treated according to piecewise linear trajectory p1. The donor material 230 is then shifted in the x-direction to supply fresh donor material and subsequently, in a second time unit the laser beam 202 is guided along the set of TSVs 1 to be treated according to piecewise linear trajectory p2. With the donor material shifted in a further position, the laser beam 202 is subsequently guided along the set of TSVs 2 to be treated according to piecewise linear trajectory p3 in a third time unit. With the donor material shifted in a further position treatment of the set of TSVs 2 is repeated, using trajectory 4. It is noted that it is not necessary to shift the donor material stepwise. Preferably the donor material 230 is moved at a constant speed, to avoid accelerations. Likewise the wafer can be displaced at a constant speed.

Comparing the patterns of used donor in FIG. 4B and FIG. 5B, it can be seen that the donor material can be even more efficiently used. I.e. in FIG. 5B the consumed donor positions 232 are concentrated in a length portion 230A that is only about ¾ of the length portion used in FIG. 4B. Accordingly, the length portion 230B is readily available to fill subsequent TSV patterns. Additionally a reduction of the speed of the donor material can be achieved without compromising productivity as the donor material now only needs to be transported along a length of 6 times the diameter of the consumed donor locations.

Figure 6A:
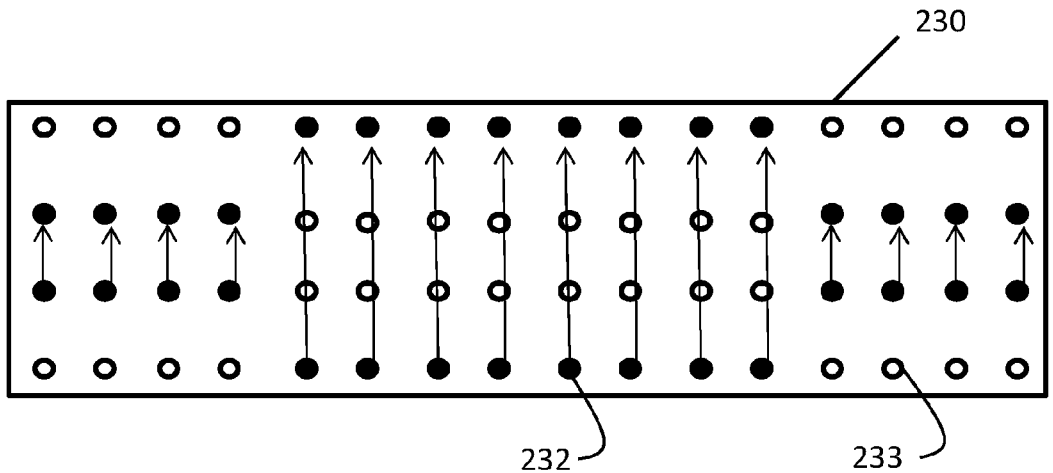
FIG. 6A shows a donor usage profile for the possible treatment according to the clustering of the pattern of FIG. 4A and using four donor area units for each TSV in the pattern.
Figure 6B:
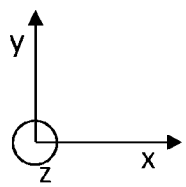
FIG. 6B shows a donor usage profile for the treatment according to the embodiment of the present invention with the clustering of the pattern of FIG. 5A and using four donor area units for each TSV in the pattern.
Figure 6B:
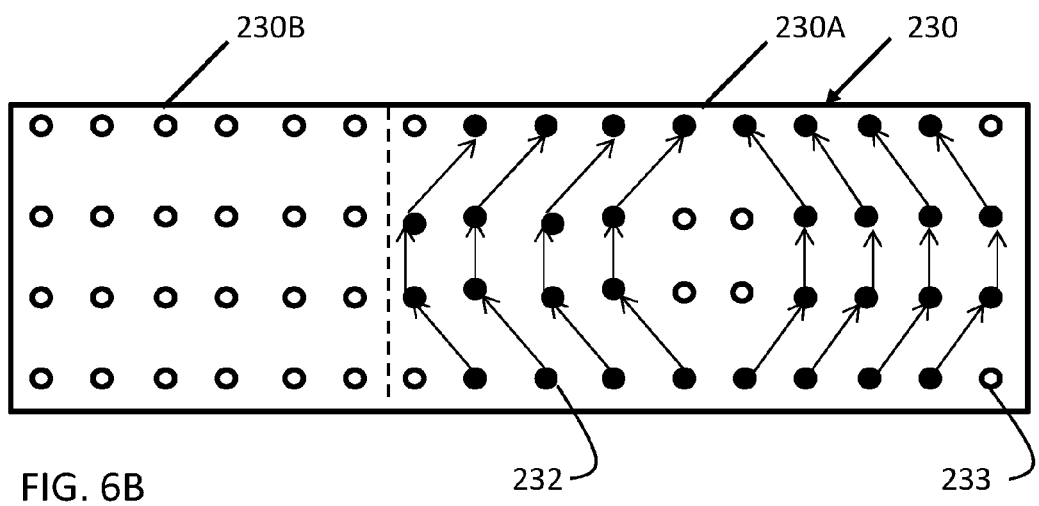

As in practice the required number of shots per via is substantially higher, the advantage obtained by the method of the present invention is also significantly higher. An illustration is given in FIGS. 6A and 6B for the case that the number of shots per via is 4, which is still a relatively low number as compared to the required number for practical purposes (e.g. 50-100). FIG. 6A shows donor use in case the TSVs filled in the sequence as indicated in FIG. 4A. FIG. 6B shows donor use in case the TSVs filled in the sequence as indicated in FIG. 5A. It can be seen that in this case the donor material is even more efficiently used, in that the length portion 230A in FIG. 6B is only ⅝ of the length portion used in FIG. 6A. In FIG. 6A, the required donor length would be 16 length units (diameter of consumed donor portions) to fill each TSV pattern, whereas the required donor length in case of FIG. 6B is only 10 length units. Accordingly, the donor speed can now be reduced to ⅝ of the speed that would be required to the donor speed in the example described with reference to FIG. 6A.

In particular the speed can be substantially lower than as compared to the case wherein the laser beam is scanned in the transport direction of the donor. The latter approach would require that the donor material is transported over a distance of 32 length units in order to maintain the same productivity. Accordingly as compared to this case the speed can be reduced by more than a factor 3, whereas a very efficient donor usage is achieved, i.e. in the length portion 230A about 80% of the donor material is used.

Figure 2:
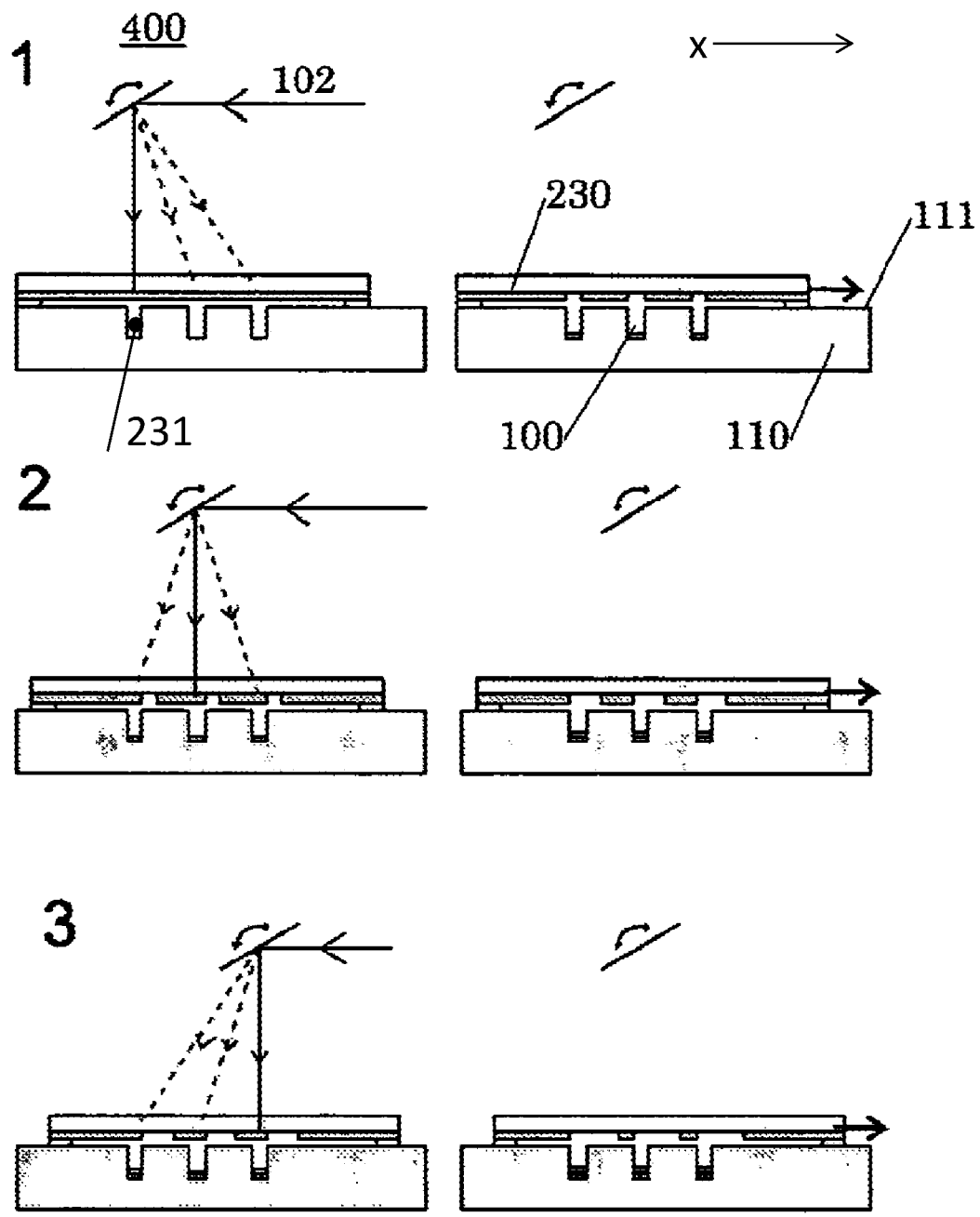
FIG. 2 shows subsequent stages of the treatment.

Theoretically an efficient donor usage would be possible when scanning the laser exclusively in the transport direction as shown in FIG. 2. However, this would only be possible if the donor carrier 230 can be very accurately positioned in the direction y, so that each time the donor carrier passes the field of view a track of unused donor material is available that is very close to the track of used donor positions. However in practice this is not possible due to the high speed in which the donor carrier is transported (e.g. in the order of 10 m/s). Hence in practice the known method requires that a larger distance is maintained between the tracks, resulting in a less efficient donor use.

Figure 7:
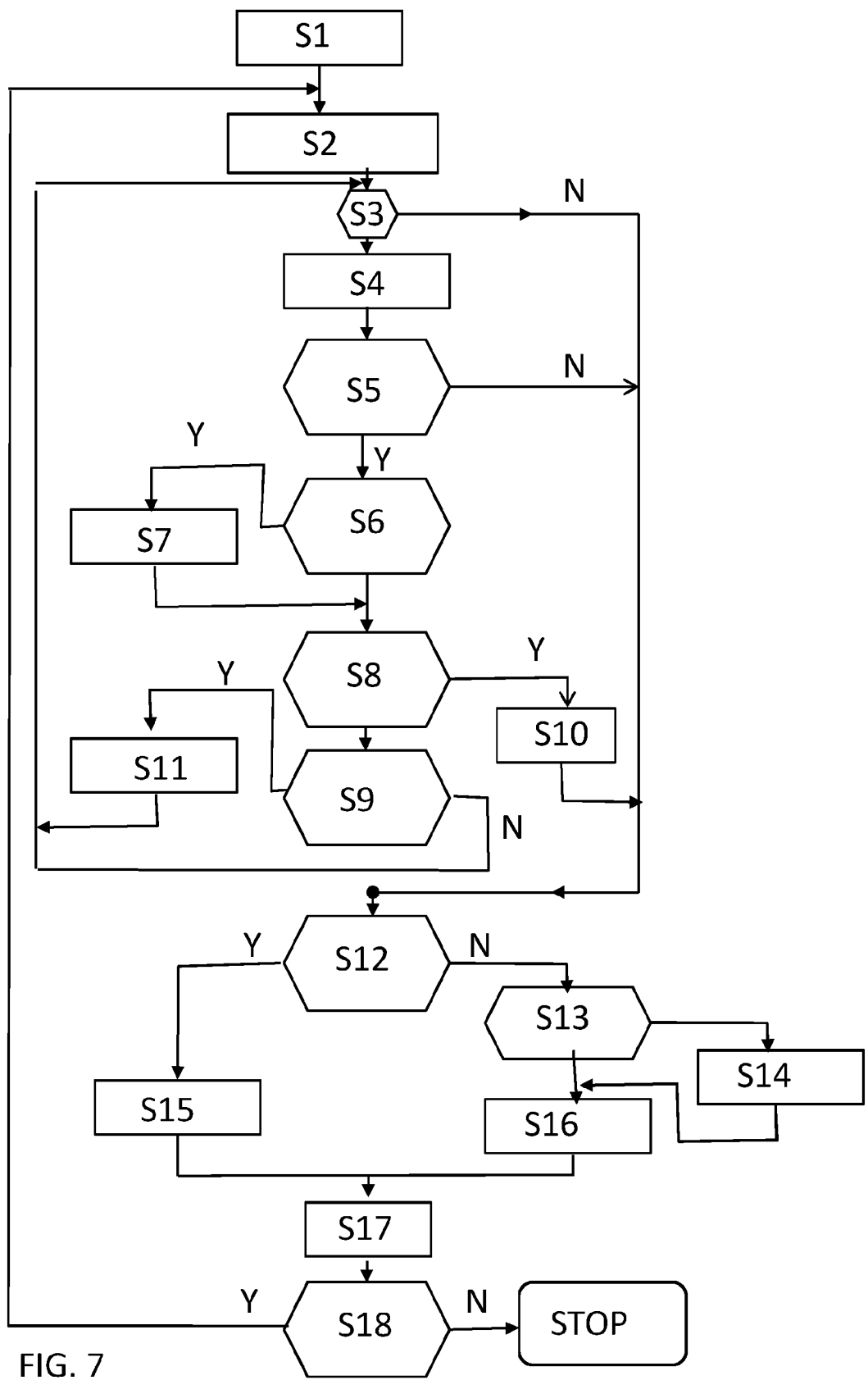
FIG. 7 shows an embodiment of a method according to the present invention to prepare control information for controlling a position of a laser beam for treatment of TSVs of a chip die in a chip manufacturing process.

FIG. 7 shows an embodiment of a method according to the third aspect of the invention that can be used to prepare clustered control information for controlling position of a laser beam for treatment of a chip die in a chip manufacturing process. For convenience it is presumed that the wafer moves with a constant velocity $v_w$, and that the donor material moves with a constant velocity $v_d$ in the direction x. However, alternatively the wafer and or the donor material may be transported stepwise. In a first step S1 a list is provided that indicates a number of Np feature positions (x,y) of electrically conductive elements to be formed, for example positions of TSV's on the wafer. The x-component indicates the position in the direction wherein the wafer is transported during the LIFT-process. The list may be prepared during the design process, but may alternatively be generated by an image recognition procedure from an image of the wafer. The list provided in step S1 may be obtained by conversion of differently formatted data, e.g. a 2-dimensional matrix that indicates a grid, wherein each entry in the matrix indicates whether or not the corresponding point of the grid is a location where an electrically conductive element is specified in the chip design. Subsequently in step S1 the entries in the list are sorted according to the value of their x-coordinate and the following variables are initialized. Although this step is not necessary it facilitates further computations.

$t=0$: The current time $Lt=Ns*D$ The donor track length.

The donor track length may be a length of donor material used to fill a single TSV. Therein D is the spotsize of removed material for each 'shot' and Ns is the number of shots required per TSV.

Typically the number Ns is in a range from 10 to 200, for example about 100. The spotsize is usually in the micrometer range, e.g. between 10 and 30 micrometer. Alternatively the donor track length may be an indication of the degree of overlap of target ranges along a trajectory where an electrically conductive track is formed. In case a relatively large thickness of the electrically conductive track is required, e.g. for a power supply line, a bigger donor track length is required to obtain the necessary degree of overlap than in case a thinner electrically conductive track is required.

Also the following variable Lw is initialized $Lw = Lt^* v_w/v_d$, The wafer track length, the distance traveled by the wafer in the time period corresponding to Ns shots.

In the subsequent steps a cluster of feature positions is selected that is within a predetermined two-dimensional spatial range, wherein each pair of feature positions in the cluster at least has a first minimum difference in their first coordinates or a second minimum difference in their second coordinates and removing the next TSV from the ordered set.

In a next step S2 a number Nf is determined of feature positions that is not yet assigned to a cluster. Initially the value of Nf equals Np.

In step S3 it is determined whether this number Nf is greater than 0, and if so, program flow continues with step S4. Otherwise (N) program flow continues with step S12 specified below.

In step S4 a temporal position is calculated for all feature positions on the list, based on the current position $p_w$ of the wafer. Subsequently a number of conditions specified below is verified.

In step S5 it is verified whether the present feature position is already moved within the treatment area. If this is confirmed control proceeds to step S6. If the condition of step S5 is not confirmed (N) program flow proceeds with step S12, which is described below.

In step S6 it is verified whether the present feature position is at at least a predetermined distance from the feature positions previously assigned to the current cluster. If this is confirmed (Y) the feature position is added to the current cluster in step S7 and control proceeds with step S8. Otherwise control directly proceeds with step S8.

In step S8 it is verified whether the number of feature positions in the current cluster has reached a predetermined maximum. If this is the case (Y), a flag WT is set in step S10, and program flow proceeds with step S12. In favorable embodiments the predetermined maximum number is in a range of 5 to 15. If the predetermined maximum number is substantially smaller, e.g. less than 3, only a limited reduction in donor speed is obtained. If the maximum clustersize is substantially larger, e.g. larger than 20, a substantive number of clusters will not be completed. This has the effect that during execution of the method the donor will be relatively inefficiently used. Moreover, a relatively large time interval has to be reserved for carrying out the deposition step for this relatively large maximum number of feature positions. If the actual number of feature positions is systematically lower than this maximum number this has the effect that the throughput of the manufacturing process will be lower.

If the predetermined maximum number is not yet reached, control proceeds with step S9. In step S9 it is verified whether the current feature position is in the treatment area. If this is the case (Y), the flag WT is set in step S11 and control proceeds with step S3 that verifies whether there are still other feature positions that are not yet assigned to a cluster.

In step S12 it is verified by inspection of flag WT whether a cluster was found with one or more feature positions. If this is the case the status of the donor material is updated in step S15. I.e. it is recorded which feature positions in the donor material are used. In step S15 it is also recorded which feature positions in the wafer are filled and these feature positions are removed from the sorted list obtained in step S2. Furthermore, the current time is calculated, taking into account the time involved for carrying out the deposition for the feature positions in this cluster.

$$t = t + Nt^* Ns/f;$$

Therein Nt is the number of feature positions in the cluster and f is the repetition rate of the laser.

If it is determined in step S12 that flag WT is not set, it is subsequently verified in step S13 whether a feature position tends to move outside the target area. If this is the case, then in step S14 the feature position is clustered with the currently available and free feature position in the target area Additionally the time is reset to the moment that the cluster entered the target area. Subsequently control flow proceeds with step S16, wherein the time is updated according to:

$$t = t + D/v_w$$

If it is not determined in step S13 that a feature position tends to move outside the target area, control flow immediately proceeds to step S16.

Based on the time t calculated in step S15 or step S16, the current position $p_d$ of the donor material and the current position $p_w$ of the wafer is calculated in step S17 according to:

$$p_w = t^* v_w$$

$$p_d = t^* v_d$$

Therewith the relative position of the feature positions with respect to the predetermined two-dimensional spatial range, which corresponds to the field of view that is accessible by the laser beam can be determined.

Then in step S18 it is determined whether the wafer is still within the treatment area. If that is the case (Y) program flow returns to step S3. Otherwise (N) the procedure is completed.

As demonstrated with reference to FIGS. 4A, 4B, 5A, 5B and 6A, 6B the present invention enables a substantial improvement of efficiency of donor usage and a substantial reduction of the donor speed. In practice the distribution of feature positions on a die to be treated may be less favorable. One is free to rotate the wafer in any direction to make the distribution more favorable. Nevertheless also in those more typical cases the present invention allows for a substantial improvement of efficiency and reduction of speed.

Example I

Figure 8:
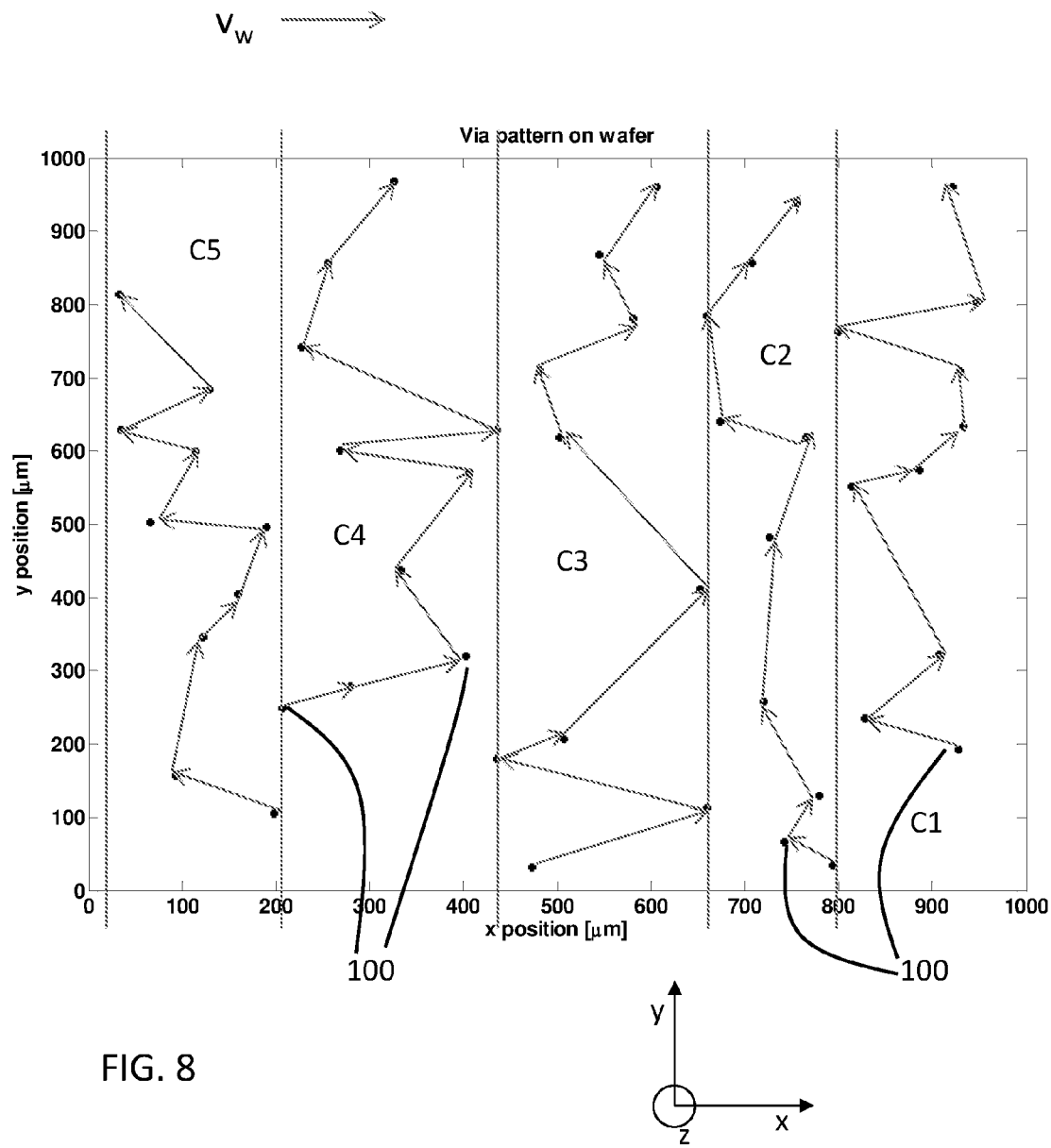
FIG. 8 illustrates a result of application of the method of FIG. 7 to a chip the having a pseudo-random distributed set of TSVs.

According to a first example a wafer is provided having a number Ntsv of 50 TSVs (semi) randomly distributed in an area of 1×1 mm² as illustrated in FIG. 8. Therein the TSVs 100 are indicated as black dots. Such a semi-random distribution may in practice occur because the locations of the TSVs may be selected on the basis of a number of mutually different design considerations A laser is provided having a spotsize of 20 um at the impingement position and having a maximum repetition rate f of 200 kHz.

It is presumed that each TSV requires Ns=100 shots to be completely filled.

According to a method of the present invention the TSV can be treated for example with the apparatus described with reference to FIG. 3, by obtaining clustered information about the TSVs to be treated. The clustered information may be obtained with the method as described with reference to FIG. 7. According to the inventive method the TSV's 100 are clustered in clusters C1, C2, C3, C4 and C5. Individual clusters comprise up to 10 TSVs that are arranged in a two dimensional zone along stepwise linear or curved trajectory. The trajectory for a cluster is indicated in FIG. 8 by a sequence of arrows between mutually subsequent TSVs.

As indicated in FIG. 3 a donor 230 is provided that is distanced from the wafer top surface and the donor is guided in a direction x relative to an identified TSV 100 on the wafer 110. Subsequently a scanning step is repeated for a predetermined number of times corresponding to the required number of shots per via. In this scanning step the laser beam is directed along the trajectory for said cluster to positions that correspond to the actual positions of the TSVs of said cluster e.g. cluster C1 to have the laser beam impinge at said positions. In practice scanning of the laser beam can take place at a relatively high speed. If the scanning step has been repeated for the predetermined number of times, a next cluster (e.g. C2) is selected that is arranged in the direction x opposite the movement direction $v_w$ and the repeated scanning step is applied to this next cluster. In order to supply fresh donor material for each repetition of the scanning step the donor material is transported. Transport can take place stepwise between subsequent repetitions, but preferably the donor material is moved at a constant speed to avoid accelerations and decelerations. Likewise the wafer may be transported stepwise, but preferably the wafer is transported at a constant speed. To enable this, the laser guiding system adapts the position of the laser beam to the actual position of the TSV 100 to be treated.

In this example each cluster comprises up to 10 TSV's (corresponding to the same number of tracks Nt of used material in the donor carrier). Both the wafer and the donor material are moved at a constant speed in a direction x. The wafer is moved with a constant speed $v_w$ of 40 mm/s in the direction x at least until an edge of the wafer is within the predetermined two-dimensional field of view. This speed corresponds to the maximum bound defined by the repetition rate (200 kHz.) of the laser divided by the product of the number (100) of shots per TSV, the size (1 mm) of the field of view in the direction transverse to the first direction and the density of the TSVs (50 TSVs in an area of 1 mm²). It is noted that the wafer speed may be lower. Preferably, however, the wafer speed is at least 0.8 times the value for said maximum bound. If the wafer speed is substantially lower than this value a less efficient production is obtained.

The donor material, here copper, is moved with a substantially constant speed $v_d$ of 440 mm/s.

This speed $v_d$ corresponds to $$V_d = v_w + D^* f/Nt$$

From the above settings it follows that the process time to scan each TSV in the cluster one time is Tsc=Nt/f=50 us, and that the total process time for each cluster taking into account the number Ns of shots per via equals $$Tcl = Ns \cdot Nt/f = 5 \text{ ms}$$

Therewith the process time for the entire pattern is 25 ms.

During each scan the wafer displaces with Tsc·$v_w$=2 um and the donor material displaces with Tsc·$v_d$=22 um The donor efficiency is the total area of used donor material, divided by the rectangular area defined by the displaced length of donor material (11 mm) and the width of the area (1 mm). Accordingly, the rectangular area defined by the displaced length of donor material is 11 mm². The total area $A_{used}$ of used donor material is given by $A_{used} = N_s \cdot N_{tsv} \cdot A_d$.

Wherein Ad is the area of a single spot of used donor material and is about 2 mm² in this example.

Accordingly the donor efficiency is about 15%

Example II

As a second example, shown in FIG. 9, a wafer is provided having a pattern of Ntsv=44 TSVs regularly arranged along the circumference of a rectangle having an area of 1×1 mm². As in the previous example, a laser is used having a spotsize d=20 um at the impingement position and having a maximum repetition rate f of 200 kHz. The laser is driven at a constant pulse frequency with this rate. It is noted that in other embodiments the time interval between subsequent laser pulses may be variable. The number of shots for each TSV (Ns) is 100

The maximum number of TSVs in a cluster Nt=6.

Both the wafer and the donor material are moved at a constant speed in a direction x. The wafer is moved with a speed $v_w$ of 40 mm/s. This speed $v_w$ corresponds to the maximum bound defined by the repetition rate (200 kHz.) of the laser divided by the product of the number (100) of shots per TSV, the size (1 mm) of the field of view in the direction transverse to the first direction and the density of the TSVs (50 TSVs in an area of 1 mm²). The donor material, here copper is moved with a speed $v_d$ of 706 mm/s. The latter speed $v_d$ corresponds to $$V_d = v_w + D^* f/Nt$$

By way of example the TSVs are clustered into 13 clusters C1-C13 as indicated in FIG. 9. The first cluster C1 comprises the first 6 TSVs on the right edge. The second cluster C2 comprises the second 6 TSVs on the right edge. Clusters C3-C7 and C11-C13 each comprise a pair of TSVs, one from the bottom edge of the rectangle and one from the top edge of the rectangle. Clusters C8 to C10 comprise a pair of TSVs, one from the bottom edge of the rectangle and one from the top edge of the rectangle and additionally comprise a cluster of TSVs from the leftmost edge of the rectangle. Other clusterings are possible wherein TSVs of individual clusters are arranged along a stepwise linear or curved trajectory within a two-dimensional zone. I.e. the bounding box, shown as a dashed contour for cluster C10, has a minimum size of at least 10 times the diameter of the TSVs both in the transport direction x of the donor and in the direction transverse to the donor.

For this second example it follows that the process time for each scan is:

Tsc=Nt/f=30 us. The process time for each cluster is Tcl=ns·nt/f=3 ms, and the process time for the entire pattern, which comprises 13 clusters is 39 ms.

Accordingly, during each scan the wafer displaces with Tsc·$v_w$=1.2 um

And the donor material displaces with Tsc·$v_d$=21.2 um

The donor efficiency is the total area of used donor material, divided by the rectangular area defined by the displaced length of donor material (27 mm) and the width of the area (1 mm). Accordingly, the rectangular area defined by the displaced length of donor material 27 mm². The total area of used donor material is the number of TSV $A_{used} = N_s \cdot N_{tsv} \cdot A_d$. Where $A_d$~1.8 mm².

Accordingly the donor efficiency is about 6%.

Example III

Figure 10:
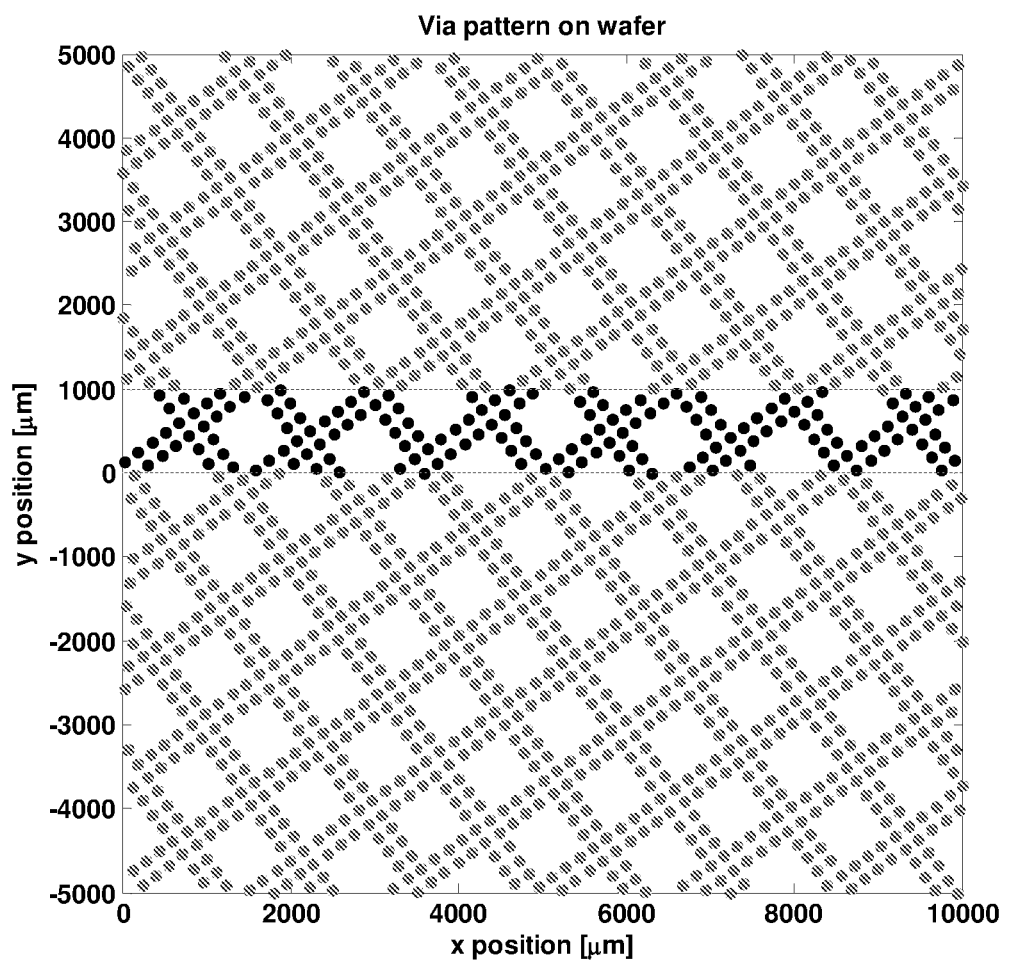
FIG. 10 illustrates a rotated wafer having a plurality of dies with TSVs arranged along their edges, to a chip die having a set of TSVs arranged along the edges of the die.

FIG. 10 shows a further example. As in the previous example illustrated with reference to FIG. 9, the basic pattern comprises Ntsv=44 TSVs regularly arranged along the circumference of a rectangle having an area of 1×1 mm2 (for clarity only part of the TSVs in a basic pattern is shown). According to an advantageous embodiment of the method for providing position control information the positions of the TSVs are determined in a second coordinate system in a plane defined by the chip die and rotated with respect to the coordinate system of the received specification. Subsequently, the clusters of TSVs to be treated are determined for example according to the method described with reference to FIG. 7. Hence the positions in this second coordinate system replace the coordinates in the original coordinates. It is noted that the calculation may take place an arbitrary long period of time before the processing of TSVs actually takes place. Accordingly ample time is available, so that the calculation may be repeated if necessary for various values of the rotation to determine which angle of rotation results in an optimum value for the average number of TSV's per cluster.

As in the previous example the diameter of the TSVs to be filled is 20 um, the number of shots per TSVs is 100 and the repetition rate of the laser is 200 kHz.

Also, as in the previous example the maximum number of TSV's per cluster is set to 6 and the density is 44 TSVs/mm².

Figure 10A:
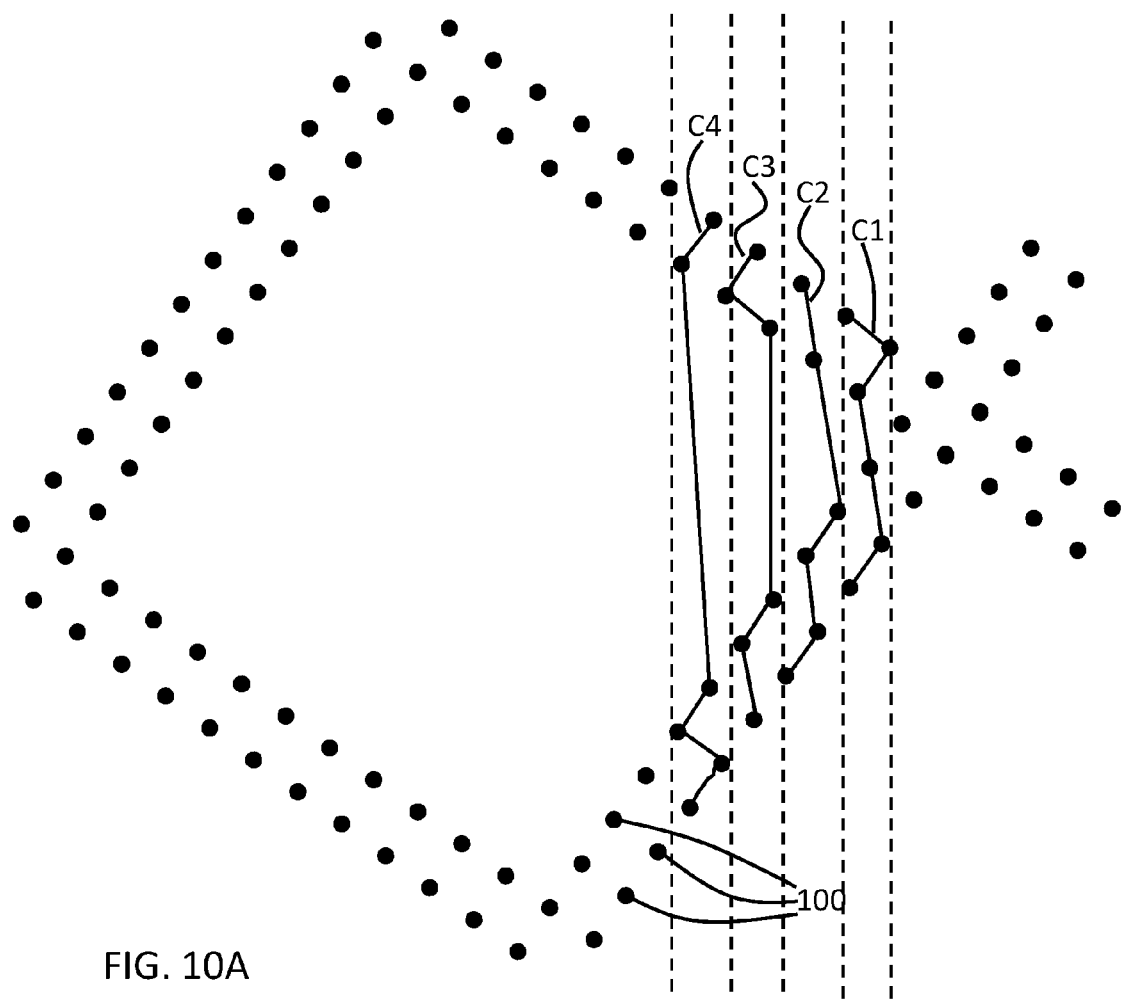
FIG. 10A shows results of the application of the method of FIG. 7 for a portion of the rotated wafer of FIG. 10.

The optimum value for the wafer speed $v_w$ was determined as 46 mm/s and the optimum value for the donor speed $v_d$ was determined to be 380 mm/s The lower value for the donor speed is enabled in that a more efficient clustering of TSVs is possible in the rotated pattern. As illustrated in FIG. 10A for a portion of the TSV pattern, most clusters (e.g. C1, ... , C4)) can accommodate the maximum number of 6 TSVs. Hence, whereas in the second example the average number of TSVs per cluster is about 3.4, in this case the average number of TSVs is close to the maximum number of 6. Therewith also a substantial improvement of donor efficiency is achieved, i.e. for the rotated pattern the donor efficiency is 20.0%.

Figure 11:
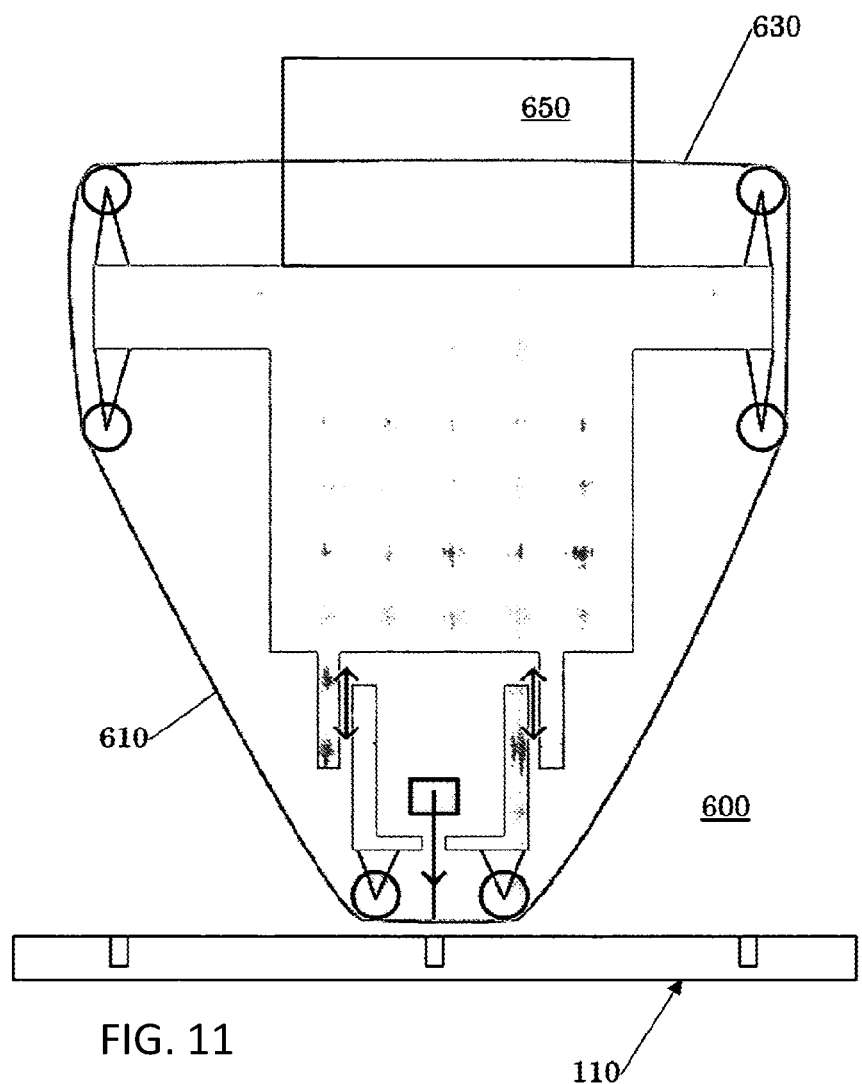
FIG. 11 shows a further embodiment of a TSV treatment apparatus.

FIG. 11 shows a donor system including a tape guiding system 600. The tape guiding system may include a premachined tape 610, for example, provided on a pair of roll-on/roll off tape spools (not shown) wherein the tape 610 is moved along a tape guiding system 600 adapted to provide the tape 610 at a constant height moving over a TSV 100 to be treated. Alternatively in the shown embodiment the tape 610 is provided endlessly and includes a regeneration system 650, for instance by having the tape 610 refreshed in a stripping step (etching/reverse plating) and a deposition step (PVD or plating). According to this embodiment a regeneration system 650 is arranged for deposition of a homogenous layer 630 of donor material on the carrier 610 that is moved from the regeneration system 650 to a TSV 100 to be treated by a stepping or continuous movement. Thus, depositing of donor material 630 can be provided on the carrier 610 prior to guiding the donor material 630 to the TSV 100 in a continuous process. The guiding system 600 may optionally be equipped with z-height-sensor (not shown) for self-z-positioning to ensure constant z-positioning.

Figure 12:
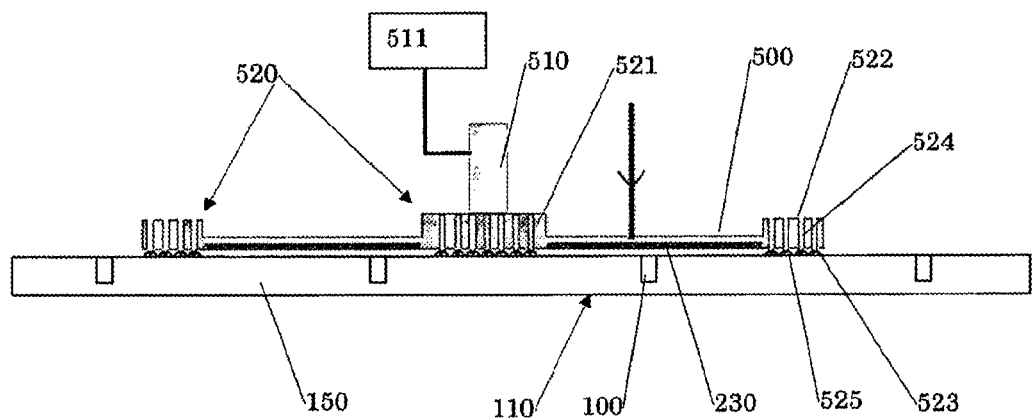
FIG. 12 shows a still further embodiment of a TSV treatment apparatus.

FIG. 12 shows an alternative embodiment comprising a donor guiding system including a rotating carrier disk 500. The rotating disc 500 may be provided on an actuator 510 that moves the disc 500 in a translational movement relative to the wafer 110, so that by the rotation fresh donor material 230 is brought over the TSV 100. The disc 500 can be provided with a z-adjustment means, for example, of an autofocus type conventional in CD-ROM technology, to mechanically control the correct height of the donor above the wafer surface. In another embodiment, the control can be provided by magnetic positioning or alternatively, as depicted, the donor guiding system comprises an air bearing 520 arranged to distance the homogenous layer 230 from the wafer top surface 111. Advantageously, the air bearing 520 spans a width of about two or three dies 150, so that a height over a single die 150 is substantially kept constant within less then 1 micron and the donor 230 is kept at an optimal distance in a range of 1-20 micron. The rotating disk 500 can be provided with a central air bearing 521 and a peripheral bearing 522; by fast rotating of the disk 500 the planar rigidity of the donor 230 is ensured. This can be further enhanced by proper design, for example, by wings provided at the disk edges and proper design of the air flows, to provide Bernoulli clamping (not shown). Accordingly, in an embodiment, the donor guiding system 500 is provided by a central air bearing 521 and a peripheral air bearing 522 spanning a donor layer 230 in a fast rotating movement. Placement of the air bearing system 520 on the wafer 110 ensures constant z-positioning of the donor material 230 relative to the wafer surface 111. The air bearing 520 typically comprises a set of flow channels 522 and a bearing surface 523 conventionally known, so that the bearing surface 523 and the flow channels 524 can be tuned to provide an air bearing layer 525 ensuring constant z-positioning. In addition, the disk actuator 510 comprises a controller 511 to adjust the rotation speed to keep the relative velocity to the TSV substantially constant. In an advantageous embodiment, the controller 511 controls the carrier disk 500 to rotate at a velocity of more than 4 m/s relative to the TSV 100 to be filled.

Figure 13:
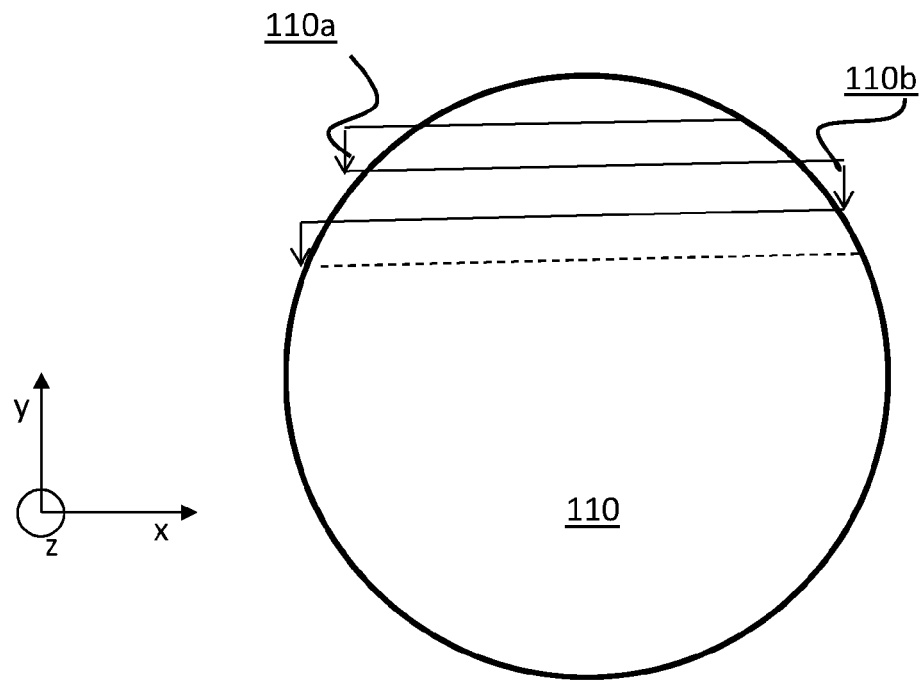
FIG. 13 shows a meandering pattern for positioning the wafer.

FIG. 13 illustrates an embodiment wherein the wafer 110 is moved by repeating a meandering pattern. In FIG. 13, the arrows indicate the corresponding shift of the predetermined two-dimensional range over the surface of the wafer. The meandering pattern subsequently comprising moving in the first direction (x) at a substantially constant speed until a first edge 110a of the wafer is within the predetermined two-dimensional range, moving the wafer in the second direction (y), moving opposite (−x) to the first direction at said substantially constant speed until a second edge 110b of the wafer, opposite to the first edge, is within the predetermined two-dimensional range, moving the wafer in the second direction (y).

As indicated above the electrically conductive elements to be applied may comprise electrically conductive tracks in a plane aligned with a main surface of the die. In that case the cluster of target positions comprises a subset of target positions arranged along a trajectory in said plane.

Figure 14A:
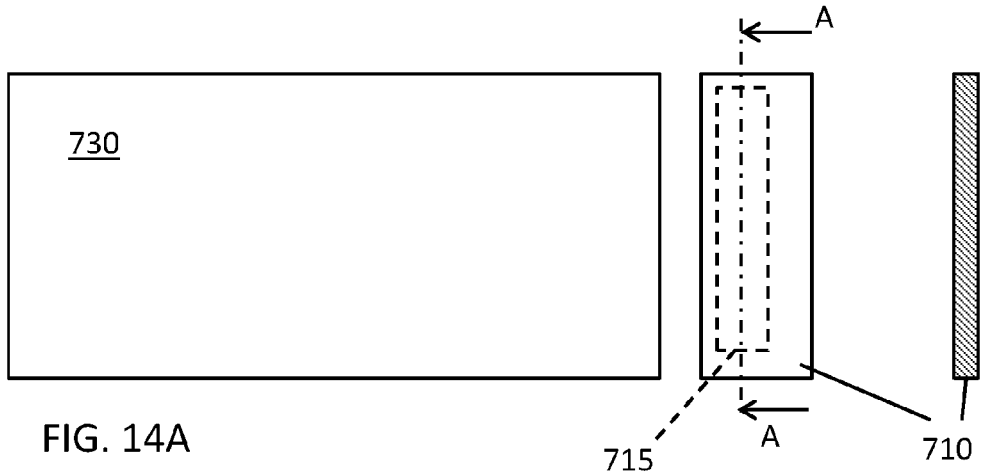
FIG. 14A-14C show subsequent stages of a first alternative method according to the second aspect of the present invention.
Figure 14B:
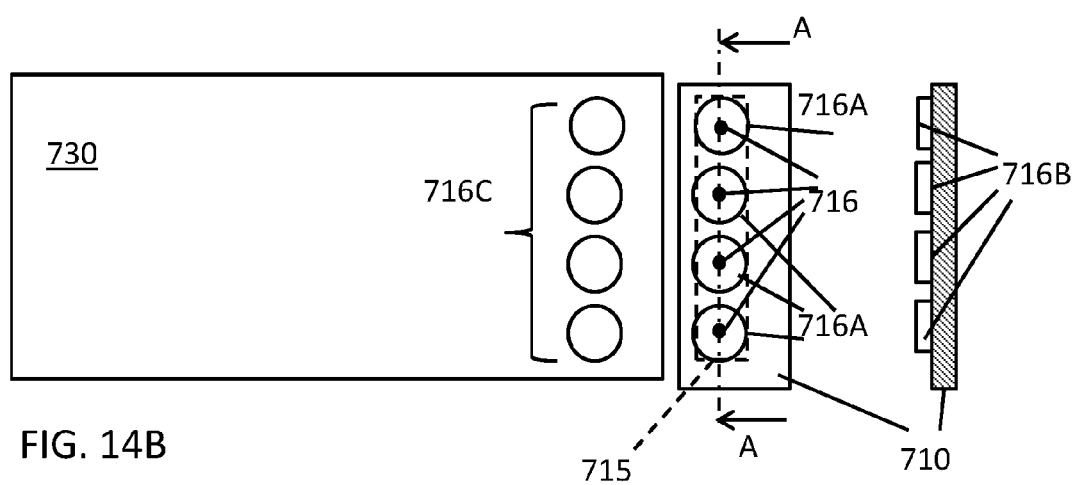
Figure 14C:
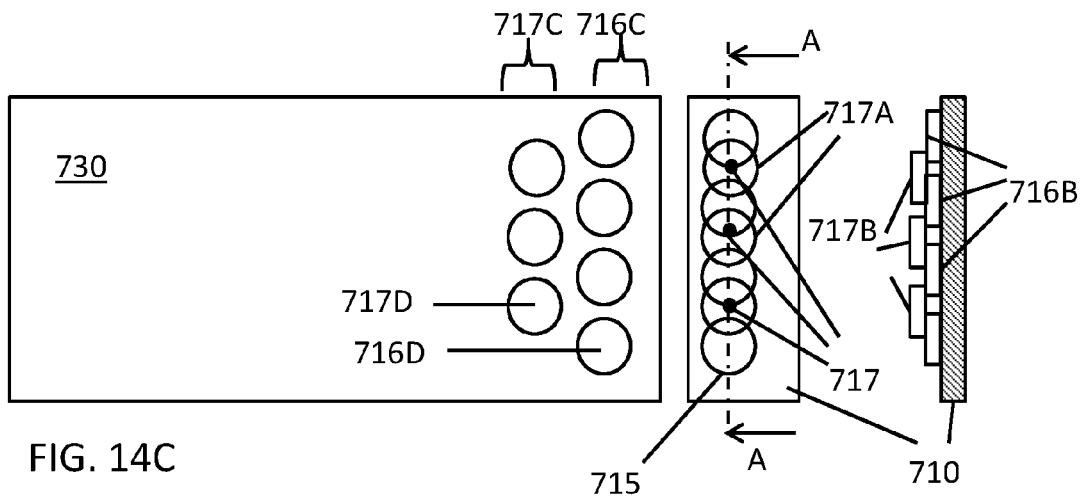

FIG. 14A-14C shows a first example. In each of these figures the left part shows a portion of the donor material 730, the middle part of FIG. 14 shows a portion of the surface of the die 710 and the right part of FIG. 14 shows a cross-section through the die 710 according to A-A in the middle part in respective stages of an embodiment of a manufacturing process according to the present invention In the example shown in FIG. 14A the dashed rectangle 715 illustrates an electrically conductive element to be applied in the form of an electrically conductive track in a plane aligned with a main surface of the die 710.

As illustrated in FIG. 14B, the position control information for controlling an impingement position of a laser beam for application of electrically conductive elements comprises a first cluster of target positions 716 arranged along a trajectory in said plane that is to be provided with said electrically conductive track 715. In the method according to the second aspect a laser beam is applied on a side of the donor 730 opposite a side facing the wafer 710. The laser beam is tuned in timing, energy and direction to cause a transfer of donor matter to the wafer to fill respective deposition ranges 716A surrounding respective identified target positions 716 from respective source positions 716C in the donor 730. Therewith, in a stage of the manufacturing process, respective spots 716B of donor material are formed on the surface of the die 710.

As shown in FIG. 14C, the position control information comprises a second cluster of target positions 717 arranged along the trajectory to be provided with the electrically conductive track 715. In a subsequent manufacturing stage illustrated by FIG. 14C a transfer of donor matter to the wafer has the effect that respective deposition ranges 717A surrounding the target positions 717 are filled using associated source positions 717C in the donor 730. Therewith respective spots 716B of donor material are formed on the surface of the die 710.

As a result of the manufacturing stage shown in FIG. 14C, donor matter from mutually disjunct source positions, e.g. 716D, 717D of the donor 730 is transferred to fill mutually overlapping deposition ranges, i.e. the deposition range 716A corresponding source position 716D overlaps deposition range 717A corresponding source position 717D. Therewith the donor material 716B, 717B deposited in the mutually overlapping deposition ranges 716A, 717A forms an electrically conductive track 715.

Figure 15A:
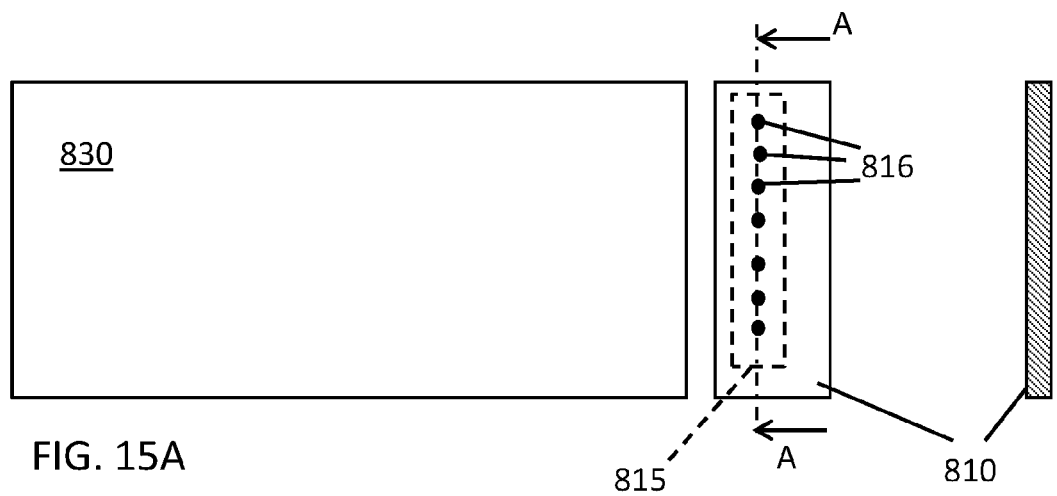
FIG. 15A-15B show subsequent stages of a second alternative method according to the second aspect of the present invention
Figure 15B:
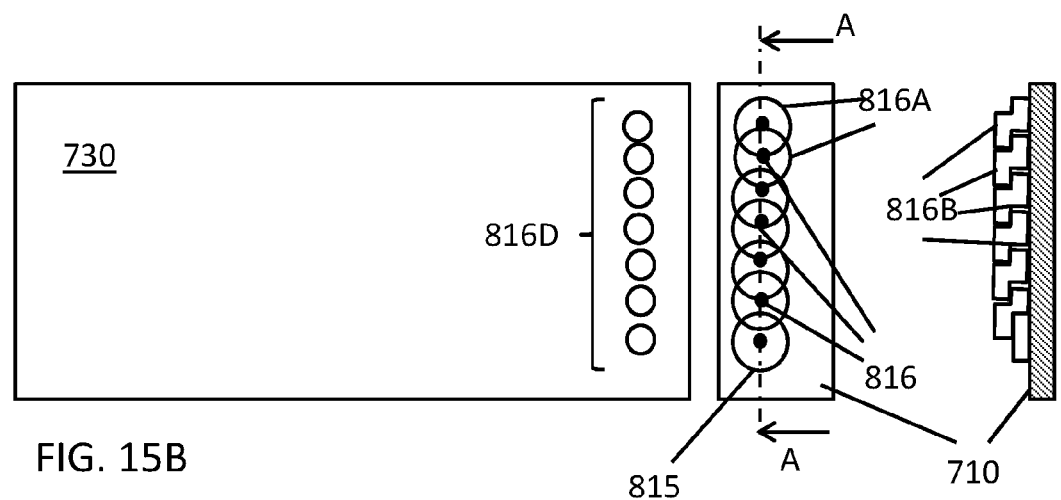

FIG. 15A, 15B shows a second example wherein the method according to the second aspect of the invention is used to apply electrically conductive tracks in a plane aligned with a main surface of the die 810 as the electrically conductive elements. In FIG. 15A, reference numeral 815 indicates a trajectory to be provided with an electrically conductive track 715 and 816 indicate target positions along this trajectory. In this case a method according to the third aspect of the invention is applied, wherein target positions 816 having mutually overlapping deposition ranges 816A (See FIG. 15B) may be comprised in a same cluster, provided that the corresponding source positions 816D do not overlap each other. Accordingly, as a result of the manufacturing stage shown in FIG. 15B, donor matter from mutually disjunct source positions, e.g. 816D of the donor 730 is transferred to fill mutually overlapping deposition ranges 816A. Therewith the donor material 816B deposited in the mutually overlapping deposition ranges 816A forms an electrically conductive track 815. An implementation according to this second example is suitable if a relatively powerful laser in combination with a donor that comprises a relatively thick layer of donor material. In that case a relatively large deposition range on the wafer can be achieved with a relatively small source range.

By way of example an electrically conductive track is shown formed by only a modest number of portions of donor material. In practice however such tracks may be formed of a substantially larger number, e.g. thousands of portions. The electrically conductive tracks need not follow a trajectory in the form of a straight line, but may be curved or be piece-wise linear. It will be understood that the electrically conductive tracks may have another orientation than the those shown in these examples.

As described above the apparatus according to the first aspect and the method according to the second aspect can be used to provide various electrically conductive elements in a chip die, such as transverse electrical conductors in TSVs or electrical conductors extending along a trajectory in a plane according t the surface of the chip die, e.g. on the surface or in a layer below the surface. To that end the method according to the third aspect may provide the control information in separate clusters for each type (transverse or in plane) of conductor. Alternatively position control information for different types of electrically conductive elements may be combined in a single cluster. This has the effect that during application of the apparatus according to the first aspect or the method according to the second aspect, within a single scanning operation of the laser beam donor material is deposited in one or more TSVs to be filled and along the trajectory of one or more in plane electrical conductive elements to be formed.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A method for manufacturing a chip die, the method comprising providing the chip die with electrically conductive elements using a clustered position control information set for controlling an impingement position of a laser beam for application of the electrically conductive elements, wherein the clustered position control information set is created by a method comprising:
receiving a specification of a set of feature positions indicating where the electrically conductive elements are to be formed on the chip die, each feature position of the set of feature positions having a first coordinate along a first direction and a second coordinate along a second direction in a plane defined by the chip die, said first direction and said second direction being mutually transverse,
selecting from said set of feature positions a cluster of feature positions positioned within a two-dimensional spatial range, wherein each pair of feature positions in the cluster at least has a first minimum difference in their first coordinates or a second minimum difference in their second coordinates,
removing the feature positions selected for said cluster from the set of feature positions to render a set of remaining feature positions,
estimating relative positions of the set of remaining feature positions with respect to the two-dimensional spatial range in accordance with:
an expected time needed to deposit electrically conductive material at the feature positions in the cluster of feature positions, and
a speed with which a wafer comprising the chip die is to be moved during the chip manufacturing process,
repeating the selecting, removing and estimating until each of the feature positions in said set of feature positions is assigned to a cluster.

2. The method according to claim 1, wherein the electrically conductive elements to be applied comprise an electrically conductive track in a plane aligned with a main surface of the chip die, and wherein the cluster of feature positions comprises a subset of feature positions arranged along a trajectory in said plane aligned with a main surface of the chip die.

3. The method according to claim 2, wherein the clustered position control information comprises at least a first cluster and a second cluster with feature positions arranged along the trajectory, wherein the feature positions of the first cluster have mutually non-overlapping target ranges, wherein the feature positions of the second cluster have mutually non-overlapping target ranges, and wherein the target ranges of the feature positions of the first cluster overlap the target ranges of the feature positions of the second cluster.

4. The method according to claim 2, wherein the clustered position control information comprises at least a first cluster having feature positions with mutually overlapping target ranges.

5. The method according to claim 1, wherein the electrically conductive elements comprise transverse electrical connections extending in a direction transverse to a main surface of the chip die through a TSV in the chip die, and wherein the specification of feature positions comprises positions of a set of TSVs in the chip die.

6. The method according to claim 1, further comprising, subsequent to receiving the specification and before selection from the set of feature positions, determining the feature positions in a second coordinate system in a plane defined by the chip die and rotated with respect to the coordinate system of the received specification, and replacing in said set the original coordinates by the coordinates obtained by said rotation, said rotation being selected to improve an average number of feature positions in a cluster.

7. The method according to claim 1, wherein a number of feature positions in a cluster is limited to a maximum number in a range between 5 and 15 feature positions.

8. The method of making a chip die of claim 1, further comprising:

clamping a wafer having a set of identified feature positions to be provided with an electrically conductive material;

providing a donor distanced from the wafer top surface and guiding the donor in a guiding direction relative to the wafer;

aligning a laser beam of a laser system the laser system defining a coordinate system, and the feature positions corresponding to respective target positions in said coordinate system, impinging the laser beam on a side of the donor opposite a side facing the wafer; the laser beam tuned in timing, energy and direction to cause a transfer of donor matter to the wafer to fill respective deposition ranges surrounding respective identified target positions from respective source ranges surrounding respective source positions in the donor, selecting a cluster of feature positions from said clustered position control information, within a field of view in the plane of the wafer that substantially extends in a direction transverse to a transport direction of the donor and directing the laser beam to the target positions that correspond to individual feature positions of said cluster of feature positions to have the laser beam impinge at said respective source positions corresponding to said target positions, selecting, if a next cluster is available in said clustered feature position information, according to an order indicated in said clustered feature position information, the next cluster as the selected cluster and repeating the selecting a cluster and the selecting a next cluster steps, wherein donor matter from mutually disjunct source ranges of the donor is transferred to mutually overlapping deposition ranges.

9. The method according to claim 8, wherein the electrically conductive elements to be provided comprise at least one electrically conductive track, and wherein clustered feature positions are mutually disjunct positions arranged along a trajectory to be provided with said electrically conductive track, said trajectory extending in a plane coinciding with a main surface of the die.

10. The method according to claim 8, wherein the electrically conductive elements to be provided comprise transverse electrical connections extending in a direction transverse to a main surface of the die through a TSV in the die, and wherein the specification of feature positions (x,y) comprises positions of a set of TSVs in the chip die and wherein the cross-section of each TSV identifies a respective deposition range and wherein said method further includes for each cluster repeating the selecting a next cluster.

11. The method according to claim 10, wherein the wafer is moved in the first direction at a substantially constant speed until an edge of the wafer is within the two-dimensional spatial range corresponding to a field of view, wherein a maximum bound for the wafer speed is equal to a repetition rate of the laser divided by the product of the number of shots per TSV, the size of the field of view in the direction transverse to the first direction and the density of the TSVs (the number of TSVs per area unit).

12. The method according to claim 11, wherein the wafer speed is at least 0.8 times the maximum bound for the wafer speed.

13. A method according to claim 11, further comprising moving the donor material in said first direction at a speed that is at least equal to a sum of a value of a substantially continuous speed of the wafer and a product of a repetition rate of the laser and of a diameter (d) of empty spots in the donor material caused by impingement of the laser beam and a reciprocal value of a maximum number of TSVs in a cluster.

14. A method according to claim 12, wherein the wafer is moved by repeating a meandering pattern, the meandering pattern subsequently comprising moving in the first direction at a substantially constant speed until a first edge of the wafer is within the two-dimensional spatial range corresponding to the field of view, moving the wafer in the second direction, moving opposite to the first direction at said substantially constant speed until a second edge of the wafer, opposite to the first edge, is within the predetermined two-dimensional field of view, moving the wafer in the second direction.

15. A method according to claim 14, comprising moving the donor material with a speed that is at least equal to a sum of an absolute value of the substantially continuous speed of the wafer and a product of a repetition rate of the laser beam, a diameter (d) of empty spots in the donor material caused by impingement of the laser beam and the reciprocal value of a maximum r number of TSVs in a cluster.

16. A chip die treatment apparatus for providing, in a chip manufacturing process, a chip die with electrically conductive elements, the chip die treatment apparatus comprising:

a carrier plate comprising clamping zones on a top ace arranged for placement of a wafer;

a donor guiding system for guiding a donor along a first direction over the wafer to be treated, the donor guiding system keeping the donor distanced from the wafer top surface;

an alignable laser system arranged for impinging a laser beam within a field of view on a side of the donor opposite a side facing the wafer, wherein the alignable laser system defines positions according to a coordinate system, wherein the identified feature positions correspond to respective target positions in the coordinate system, and wherein the laser beam is tuned in timing, energy and direction to cause a transfer of donor matter to the wafer to fill respective deposition ranges surrounding respective identified target positions from respective source ranges surrounding respective source positions in the donor;

a control system for aligning the laser beam and the donor guiding system relative to the wafer; and a facility for obtaining a clustered position control information set for controlling an impingement position of the laser beam for application of electrically conductive elements at identified feature positions arranged in clusters of feature positions, wherein the clustered position control information set is obtained for the identified feature positions by a method comprising:

receiving a specification of a set of feature positions indicating where the electrically conductive elements are to be formed on the chip die, each feature position of the set of feature positions having a first coordinate along a first direction and a second coordinate along a second direction in a plane defined by the chip die, said first direction and said second direction being mutually transverse, selecting from said of feature positions a cluster of feature positions positioned within a two-dimensional spatial range, wherein each pair of feature positions in the cluster at least has a first minimum difference in their first coordinates or a second minimum difference in their second coordinates, removing the feature positions selected for said cluster from the set of feature positions to render a set of remaining feature positions, estimating relative positions of the set of remaining feature positions with respect to the two-dimensional spatial range in accordance with;

an expected time needed to deposit electrically conductive material at the feature positions in the cluster of feature positions, and a speed with which a wafer comprising the chip die is to be moved during the chip manufacturing process, repeating the selecting, removing and estimating until each of the feature positions in said set of feature positions is assigned to a cluster;

wherein the apparatus, when in an operational state, performs a die treatment operation comprising:

selectin, from the clustered position control information, a cluster of feature positions, within the field of view of the alignable laser system the substantially extends in a transport direction of the donor, and directing the laser beam to target positions that correspond to individual feature positions of the cluster of feature positions to have the laser beam impinge at said respective source positions of the donor corresponding to said target positions of the wafer; and next selecting a next cluster of the clustered position control information set, according to an order indicated in the cluster position control information set, and directing the laser beam to target positions that correspond to individual feature positions of the next cluster of feature positions to have the laser beam impinge at said respective positions of the donor corresponding to said target positions of the wafer.

17. A record carrier for use with a chip die treatment apparatus for providing chip dies in a chip manufacturing process with electrically conductive elements, the record carrier comprising a specification of feature positions (x,y) coinciding with positions of the chip die where the electrically conductive elements are to be formed, the feature positions having a first coordinate along a first direction (x) and a second coordinate (y) along a second direction in a plane defined by the chip die, said first and second direction being mutually transverse to each other, the target positions in the specification being provided in clusters for respective areas of the chip die wherein the chip die treatment apparatus during operation uses the information in the record carrier to subsequently provide the wafer with electrically conductive structures in accordance with the specification according to a sequence specified by the record carrier.

18. The apparatus of claim 16, wherein the donor guiding system comprises a movable transparent carrier kept distanced from a top surface of the wafer and having the donor provided on a face thereof.

19. The apparatus of claim 16, wherein the laser beam is arranged to impinge on the donor via a carrier face opposite the donor.

20. The apparatus of claim 16, wherein donor matter from mutually different source positions of the donor is transferred to mutually overlapping deposition ranges.

* * * * *